United States Patent
Takasu et al.

(10) Patent No.: US 9,105,822 B2
(45) Date of Patent: Aug. 11, 2015

(54) MATERIAL FOR A MOLDED RESIN FOR USE IN A SEMICONDUCTOR LIGHT-EMITTING DEVICE

(71) Applicant: Mitsubishi Chemical Corporation, Chiyoda-ku (JP)

(72) Inventors: Mayuko Takasu, Kitakyushu (JP); Takeshi Otsu, Yokohama (JP); Kenichi Takizawa, Kitakyushu (JP); Yutaka Mori, Kitakyushu (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 52 days.

(21) Appl. No.: 14/100,096

(22) Filed: Dec. 9, 2013

(65) Prior Publication Data

US 2014/0091266 A1   Apr. 3, 2014

Related U.S. Application Data

(63) Continuation of application No. 13/529,587, filed on Jun. 21, 2012, now abandoned, which is a continuation of application No. PCT/JP2010/073168, filed on Dec. 22, 2010.

(30) Foreign Application Priority Data

Dec. 22, 2009  (JP) ................................ 2009-291483
Apr. 30, 2010  (JP) ................................ 2010-104821

(51) Int. Cl.
*F21V 9/00*    (2006.01)
*G02B 5/02*    (2006.01)
(Continued)

(52) U.S. Cl.
CPC ................. *H01L 33/56* (2013.01); *C08L 83/04* (2013.01); *C08G 77/12* (2013.01); *C08G 77/20* (2013.01);
(Continued)

(58) Field of Classification Search
USPC .......................... 252/582; 264/328.1; 524/588
See application file for complete search history.

(56) References Cited

U.S. PATENT DOCUMENTS

2002/0132108 A1   9/2002   Ikegawa et al.
2009/0021141 A1   1/2009   Emoto et al.
(Continued)

FOREIGN PATENT DOCUMENTS

JP   2002-283496 A   10/2002
JP   2004-288937 A   10/2004
(Continued)

OTHER PUBLICATIONS

Office Action and Search Report issued on Oct. 7, 2014 in the corresponding Taiwanese Patent Application No. 099145170 (with English Translation).
(Continued)

*Primary Examiner* — Bijan Ahvazi
(74) *Attorney, Agent, or Firm* — Oblon, McClelland, Maier & Neustadt, L.L.P.

(57) ABSTRACT

The present invention provides a material for a molded resin as a material for a semiconductor light-emitting device that can yield a highly durable (light resistance and heat resistance) molded resin and can also improve the LED output through an excellent reflectivity. The present invention also provides an easily moldable material for a molded resin for a semiconductor light-emitting device. The material for a molded resin for a semiconductor light-emitting device is a resin composition, comprising (A) a polyorganosiloxane, (B) a white pigment, and (C) a curing catalyst, wherein the white pigment (B) has the following characteristics (a) and (b):
(a) an aspect ratio 1.2 or more and 4.0 or less, and
(b) a primary particle diameter 0.1 μm or more and 2.0 μm or less.

15 Claims, 6 Drawing Sheets

(51) Int. Cl.
| | |
|---|---|
| *G02C 7/10* | (2006.01) |
| *G02F 1/361* | (2006.01) |
| *G03B 11/00* | (2006.01) |
| *H01L 33/56* | (2010.01) |
| *B29B 7/00* | (2006.01) |
| *B29C 45/00* | (2006.01) |
| *C08L 83/00* | (2006.01) |
| *C08L 83/04* | (2006.01) |
| *C08K 3/36* | (2006.01) |
| *C08G 77/12* | (2006.01) |
| *C08G 77/20* | (2006.01) |
| *C08K 5/56* | (2006.01) |
| *C08K 3/22* | (2006.01) |

(52) U.S. Cl.
CPC ... *C08K 3/36* (2013.01); *C08K 5/56* (2013.01); *C08K 2003/2227* (2013.01); *H01L 2224/48091* (2013.01); *H01L 2224/48247* (2013.01); *H01L 2224/49107* (2013.01); *H01L 2933/0091* (2013.01)

(56) References Cited

U.S. PATENT DOCUMENTS

| | | | |
|---|---|---|---|
| 2009/0171013 | A1 | 7/2009 | Taguchi et al. |
| 2009/0239997 | A1 | 9/2009 | Taguchi et al. |
| 2009/0243467 | A1 | 10/2009 | Shimizu et al. |
| 2010/0140638 | A1 | 6/2010 | Kotani et al. |
| 2010/0164367 | A1 | 7/2010 | Shioi et al. |
| 2010/0176713 | A1 | 7/2010 | Hanamoto et al. |

FOREIGN PATENT DOCUMENTS

| | | |
|---|---|---|
| JP | 2006-100623 | 4/2006 |
| JP | 2006-100623 A | 4/2006 |
| JP | 2006-321921 A | 11/2006 |
| JP | 2007-039483 | 2/2007 |
| JP | 2007-39483 A | 2/2007 |
| JP | 2007-243076 | 9/2007 |
| JP | 2007-243076 A | 9/2007 |
| JP | 2008-291203 A | 12/2008 |
| JP | 2009-135485 | 6/2009 |
| JP | 2009-135485 A | 6/2009 |
| JP | 2009-144066 | 7/2009 |
| JP | 2009-144066 A | 7/2009 |
| JP | 2009-156416 A | 7/2009 |
| JP | 2009-221393 A | 10/2009 |
| JP | 2009-256656 A | 11/2009 |
| WO | 2008/053856 A1 | 5/2008 |
| WO | 2009/008250 A1 | 1/2009 |

OTHER PUBLICATIONS

International Search Report Issued Mar. 15, 2011 in PCT/JP2010/073168.
Internatoinal Preliminary Report on Patentability Issued Jul. 12, 2012 in PCT/JP2010/073168 filed Dec. 22, 2010.
Written Opinion of the International Searching Authority issued Mar. 15, 2011 in PCT/JP2010/073168.

MATERIAL FOR A MOLDED RESIN FOR USE IN A SEMICONDUCTOR LIGHT-EMITTING DEVICE

This application is a continuation of U.S. application Ser. No. 13/529,587 filed Jun. 21, 2012, which is a continuation of PCT/JP2010/073168 filed Dec. 22, 2010, both of which are incorporated herein by reference. This application also claims the benefit of JP 2002-291483 filed Dec. 22, 2009 and JP 2010-104821 filed Apr. 30, 2010.

TECHNICAL FIELD

The present invention relates to a material for a molded resin that is used in a semiconductor light-emitting device that has a light-emitting element, for example, a light-emitting diode, and to a molding made of the material.

BACKGROUND ART

As shown in FIG. 1, a semiconductor light-emitting device made by mounting a semiconductor light-emitting element is composed of, for example, a semiconductor light-emitting element 1, a molded resin 2, a bonding wire 3, an encapsulant 4, and a lead frame 5. The structure comprising the electro-conductive metal interconnects, e.g., the lead frame, and the insulating molded resin is referred to as the package.

Insulating materials provided by incorporating a white pigment in a thermoplastic resin, e.g., a polyamide, have already entered into general use as insulating materials used for molded resins (refer, for example, to Patent Document 1). In the case of semiconductor light-emitting devices where directionality is required of the emitted light, the light-emitting efficiency is required not just by the light emitted in the desired direction from the semiconductor light-emitting element, but also by causing light emitted in undesired directions to be reflected from, e.g., the molded resin, metal interconnects such as the lead frame, and reflectors, into the desired direction. Since thermoplastic resins such as polyamides are light permeable, the light-emitting efficiency of a semiconductor light-emitting device can be raised by incorporating—when light is to be reflected by the molded resin—a white pigment in the resin and reflecting the light emitted from the semiconductor light-emitting element by utilizing the difference in the refractive indices between the resin and white pigment.

Even when a white pigment is used in Patent Document 1, its reflection efficiency may not be satisfactory depending on the particular type of white pigment, and light absorbed in the molded resin and light penetrating through the molded resin also ultimately escape. Due to this, it has not been possible in some cases to concentrate the light from the semiconductor light-emitting element in the desired direction and the light-emitting efficiency of the semiconductor light-emitting device has been reduced as a result.

In addition, there is currently a trend toward higher reflow temperatures due to a strong trend toward the use of higher melting lead-free solders brought on by environmental concerns. Polyamides are thermoplastic resins, and polyamides are thus softened by this heat and the heat resistance of the package then becomes a problem in the case of packages that use polyamide. Furthermore, polyamides are subject to photodegradation and thermal degradation by ultraviolet radiation and heat, and degradation by light has become a problem in particular when light-emitting elements are used that have a light-emission range that extends into high-energy wavelength regions, such as the blue to near-ultraviolet semiconductor light-emitting elements whose commercialization has been ongoing in the recent years. Moreover, thermal degradation and photodegradation have become even more significant problems due to the heat and high luminous flux light generated by the semiconductor light-emitting element as a result of contemporary demands for brighter light-emitting elements.

Otherwise, an alumina-containing sintered ceramic may be used as the insulating material in those cases in which heat resistance is required (refer, for example, to Patent Document 2). A package that uses this ceramic does have a good heat resistance, but its production requires a high-temperature sintering step post-molding. This sintering step has posed the following problems: cost problems due, for example, to electricity costs; the ease of appearance of defective products due to changes in the size and shape of the molding caused by sintering; and an impaired productivity.

In contrast to the preceding, a case has also recently been introduced that is provided by molding a silicone resin composition that uses an organopolysiloxane for the resin and uses titanium oxide for the white pigment (refer, for example, to Patent Document 3). The use of the organopolysiloxane for the resin is intended to improve the heat resistance over that for the use of polyamide.

Patent Document 1: Japanese Patent Application Laid-open No. 2002-283498
Patent Document 2: Japanese Patent Application Laid-open No. 2004-288937
Patent Document 3: Japanese Patent Application Laid-open No. 2009-155415

SUMMARY OF INVENTION

Technical Problem

The following problems are produced by the use of titanium oxide for the white pigment in the case of Patent Document 3, which teaches the use of polyorganosiloxane for the resin.

First, titanium oxide has a low dispersibility in the resin when, during the step of preparing the resin composition, titanium oxide is added to and mixed into the polyorganosiloxane used for the resin. As a consequence, the titanium oxide is not uniformly dispersed in the molded resin provided by the cure of the resin composition and the reflectivity within the molded resin is then not constant, which results in problems with the uniformity of the light emitted from the semiconductor light-emitting device.

In addition, since titanium oxide is photocatalytic, when a semiconductor light-emitting element having a wavelength at or below about 470 nm is used, the molded resin in proximity to a titanium oxide particle is degraded by the light emitted by the semiconductor light-emitting element and by the light generated by phosphors excited by the light emitted by the semiconductor light-emitting element. As a consequence, the light resistance of the molded resin is seriously impaired when a semiconductor light-emitting element is used that emits light in the blue region and when a semiconductor light-emitting element is used that emits light in the near-ultraviolet region.

Furthermore, titanium oxide has an absorption wavelength in the near-ultraviolet region and as a result its color assumes a yellowish tinge. Due to this, the spectrum of the light emitted from the semiconductor light-emitting element is altered, producing a problem with the whiteness and the color rendering property of the light emitted by the semiconductor light-emitting device. The whiteness and the color rendering property in particular are major requirements for the white semiconductor light-emitting devices that are currently the subject of active research, and titanium oxide is also unfavorable from this perspective.

A problem for the present invention is to provide a material for a molded resin wherein the material can yield a highly durable (light resistance and heat resistance) molded resin for a semiconductor light-emitting device and can also improve the LED output through an excellent reflectivity. Another problem for the present invention is to provide an easily moldable material for a molded resin for a semiconductor light-emitting device.

Solution to Problem

As a result of intensive investigations in order to achieve the objects indicated above, the present inventors discovered that the problems indicated above could be solved by the use of a white pigment that has specific shape characteristics in the material—wherein this material comprises a polyorganosiloxane, a white pigment, and a curing catalyst—for the molded resin for a semiconductor light-emitting device.

Thus, the present invention is as follows.

(1) A material for a molded resin for a semiconductor light-emitting device, the material comprising (A) a polyorganosiloxane, (B) a white pigment, and (C) a curing catalyst, wherein the white pigment (B) has the following characteristics (a) and (b):

(a) a primary particle aspect ratio is 1.2 or more and 4.0 or less, and (b) a primary particle diameter is 0.1 μm or more and 2.0 μm or less, (2) The material for a molded resin according to (1), wherein a median diameter of secondary particles of the white pigment (B) is 0.2 μm or more and 5 μm or less.

(3) The material for a molded resin according to (1) or (2), wherein a viscosity at a shear rate of 100 $s^{-1}$ and at 25° C. is 10 Pa·s or more and 10,000 Pa·s or less.

(4) The material for a molded resin according to (1), wherein a ratio of a viscosity at a shear rate of 1 $s^{-1}$ to a viscosity at a shear rate of 100 $s^{-1}$ of is least 15.

(5) The material for a molded resin according to any of (1) to (4), wherein the white pigment (B) is alumina.

(6) The material for a molded resin according to any of (1) to (5), wherein the ratio y/x of the median diameter y of the secondary particles in the white pigment (B) to the primary particle diameter x in the white pigment (B) is 1 or more and 10 or less.

(7) The material for a molded resin according to any of (1) to (6), wherein the polyorganosiloxane (A) is a thermosetting polyorganosiloxane that is a liquid at normal temperature and normal pressure.

(8) The material for a molded resin according to any of (1) to (7) further containing (D) a cure rate controlling agent.

(9) The material for a molded resin according to any of (1) to (8) further containing (E) a fluidity controlling agent.

(10) The material for a molded resin according to (9), wherein a total content of the white pigment (B) and the fluidity controlling agent (E) is at least 50 weight % with regard to the entire material for a molded resin.

(11) A molded resin for a semiconductor light-emitting device, that is obtained by molding the material for a molded resin according to any of (1) to (10).

(12) The molded resin according to (11), wherein a light reflectivity at a thickness of 0.4 mm and a wavelength of 400 nm is at least 60%.

(13) The molded resin according to (11) or (12), wherein the molded resin is molded by liquid injection molding.

(14) A method of producing a molded resin, comprising:
a step of producing the material for a molded resin according to any of (1) to (10); and
a step of molding the obtained material for a molded resin by injection molding.

(15) A semiconductor light-emitting device that has the molded resin according to any of (11) to (13).

(16) A material for a molded resin for a semiconductor light-emitting device, the material comprising (A) a polyorganosiloxane, (B) a white pigment, and (C) a curing catalyst, wherein a viscosity at a shear rate of 100 $s^{-1}$ and at 25° C. is 10 Pa·s or more and 10,000 Pa·s or less, and a ratio of a viscosity at a shear rate of 1 $s^{-1}$ to a viscosity at a shear rate of 100 $s^{-1}$ is at least 15.

Advantageous Effects of Invention

A highly durable (strongly light resistant and heat resistant) molded resin for a semiconductor light-emitting device, that also brings about an improved LED output through its excellent reflectivity, can be obtained using the material of the present invention for a molded resin. Moreover, the present invention provides an easy-to-mold material for a molded resin for a semiconductor light-emitting device.

DESCRIPTION OF EMBODIMENTS

Embodiments of the present invention are described in detail herebelow, but the present invention is not limited to the following embodiments and can be carried out using various modifications within the scope of its essential features.

<1. The Material for a Molded Resin for a Semiconductor Light-Emitting Device>

The material of the present invention for a molded resin for a semiconductor light-emitting device is a material that is used to mold a molded resin for a semiconductor light-emitting device. It specifically contains (A) a polyorganosiloxane, (B) a white pigment, and (C) a curing catalyst.

Figure 1:
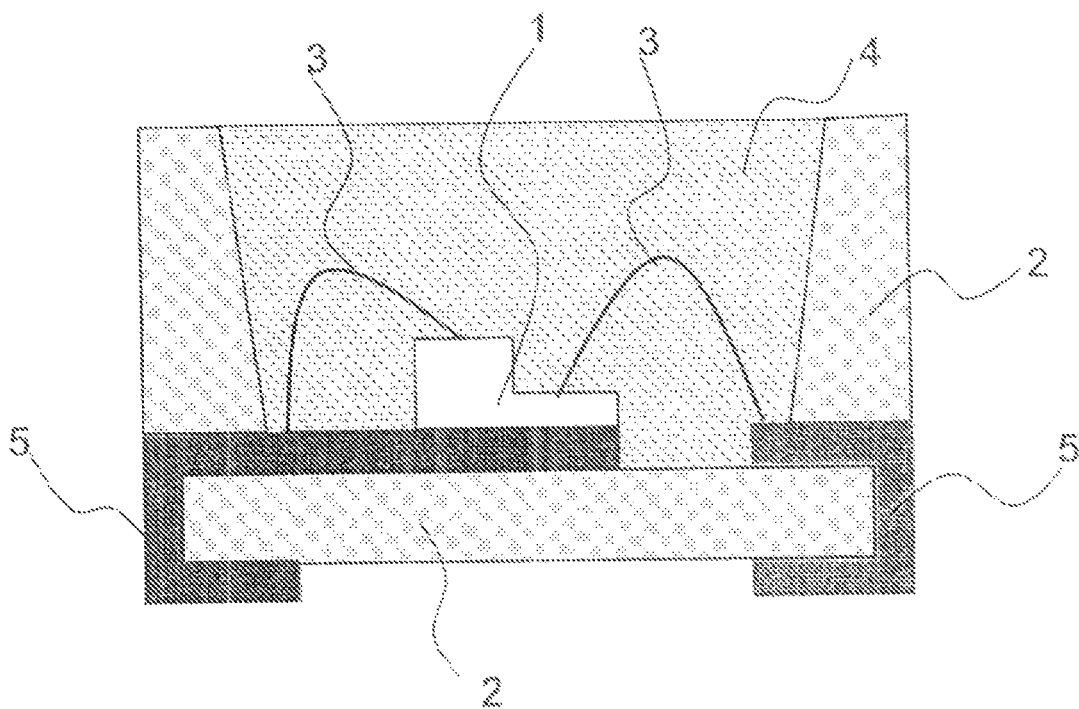
FIG. 1 is a cross-sectional diagram that schematically depicts the structure of one mode of a semiconductor light-emitting device.

Here, the molded resin for a semiconductor light-emitting device is a molding provided by the cure of the material and forms a package for a semiconductor light-emitting device by molding with an electroconductive metal interconnect such as a lead frame. The semiconductor light-emitting device is a light-emitting device that contains a semiconductor light-emitting element in the aforementioned molded resin for a semiconductor light-emitting device. A schematic diagram of the cross section of a semiconductor light-emitting device is shown in FIG. 1.

<1-1. The Polyorganosiloxane (A)>

The polyorganosiloxane in the present invention denotes a polymeric substance in which an organic group is added onto a structure that has a moiety in which a silicon atom is bonded across a oxygen to another silicon atom. This polyorganosiloxane is preferably a liquid at normal temperature and normal pressure. This facilitates handling of the material during molding of the molded resin for a semiconductor light-emitting device. In addition, a polyorganosiloxane that is solid at normal temperature and normal pressure, while generally having a relatively high hardness in the form of the cured material, tends to often have a low toughness due to the low energy required for rupture and to have an inadequate light resistance and heat resistance and thus be susceptible to discoloration by light or heat.

The normal temperature referenced above denotes a temperature in the range of 20° C.±15° C. (5 to 35° C.), and the normal pressure denotes a pressure equal to atmospheric pressure and is approximately one atmosphere. In addition, liquid denotes a state that exhibits fluidity.

The aforementioned polyorganosiloxane generally denotes an organic polymer in which the siloxane bond makes up the main chain and can be exemplified by a compound represented by the following compositional formula (1) and by mixtures thereof.

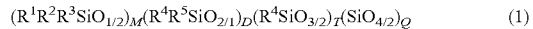
$$(R^1R^2R^3SiO_{1/2})_M(R^4R^5SiO_{2/1})_D(R^4SiO_{3/2})_T(SiO_{4/2})_Q \quad (1)$$

$R^1$ to $R^6$ is formula (1) are each independently selected from organic functional groups, the hydroxyl group, and the hydrogen atom. M, D, T, and Q are greater than or equal to 0 but less than 1 and are numbers that satisfy M+D+T+Q=1.

The main units making up the polyorganosiloxane are the monofunctional unit $[R_3SiO_{0.5}]$ (triorganosiloxane), difunctional unit $[R_2SiO]$ (diorganosiloxane), trifunctional unit $[RSiO_{1.5}]$ (organosilsesquioxane), and tetrafunctional unit $[SiO_2]$ (silicate). The properties of the polyorganosiloxane can be changed by altering the constituent proportions of these four units, and the polyorganosiloxane is synthesized using a suitable selection therefrom so as to obtain the desired characteristics.

A polyorganosiloxane in which the constituent units are mono- to trifunctional units can be synthesized based on the series of organosilicon compounds known as organochlorosilanes (general formula: $R_nSiCl_{4-n}$ (n=1 to 3)). For example, methylchlorosilane can be synthesized, for example, by the direct reaction of silicon Si and methyl chloride at high temperatures in the presence of a Cu catalyst, and silanes having an organic group, e.g., the vinyl group, can be synthesized by standard methods in organic synthetic chemistry.

A silanol is produced when the isolated organochlorosilane, either as the individual organochlorosilane or as a mixture of organochlorosilanes in any proportion, is hydrolyzed with water, and the polyorganosiloxane, which is the basic skeleton of a silicone, is synthesized by the dehydration synthesis of the silanol.

The polyorganosiloxane can be cured in the presence of a curing catalyst by the application of, for example, thermal energy or light energy. This curing refers to a change from a state that exhibits fluidity to a state that does not exhibit fluidity. For example, the uncured state refers to a state in which fluidity is present when a specimen is held for 30 minutes while inclined 45° from the horizontal, while a state in which fluidity is entirely absent can be assessed as the cured state.

Polyorganosiloxanes can generally be classified by curing mechanism into addition polymerization curing type polyorganosiloxanes, polycondensation curing type polyorganosiloxanes, ultraviolet curing type polyorganosiloxanes, and peroxide vulcanization type polyorganosiloxanes. Among these types, the addition polymerization curing types (addition-type polyorganosiloxanes) and condensation curing types (condensation-type polyorganosiloxanes) are favorable. Within these types, polyorganosiloxanes that cure by hydrosilylation (addition polymerization), which does not produce by-products and is not a reversible reaction, are more favorable. The reason for this is that when by-products are produced during the molding step, they tend to raise the pressure within the molded container and/or to remain as bubbles within the cured material.

Addition-type polyorganosiloxanes and condensation-type polyorganosiloxanes are described in greater detail in the following.

<1-1-1. Addition-Type Polyorganosiloxanes>

Addition-type polyorganosiloxanes refer to polyorganosiloxanes in which the polyorganosiloxane chain is crosslinked by an organic addition bond. In a typical case, for example, (C1) a silicon-containing compound having an alkenyl group, e.g., a vinylsilane, is mixed with, for example, (C2) a silicon compound having the hydrosilyl group, e.g., a hydrosilane, at a quantitative ratio thus provides a total amount of hydrosilyl group that is 0.5-fold or more and 4.0-fold or less, and a compound, having the Si—C—C—Si bond, at its crosslink sites is obtained by reaction in the presence of (C3) an addition polymerization catalyst such as a Pt catalyst.

The alkenyl group-bearing silicon-containing compound (C1) can be exemplified by a polyorganosiloxane represented by the following general formula (2)

$$R_nSiO_{[(4-n)/2]} \quad (2)$$

and having at least two silicon atom-bonded alkenyl groups in each molecule.

Each R in formula (2) is independently selected from identical or different substituted or unsubstituted monovalent hydrocarbon groups and alkoxy groups and the hydroxyl group, and n is a positive number that satisfies $1 \leq n < 2$.

The alkenyl group in the alkenyl group-bearing silicon-containing compound (C1) is preferably a $C_{2-6}$ alkenyl group, for example, the vinyl group, silyl group, butenyl group, pentenyl group, and so forth. When R is a hydrocarbon group, it is selected from $C_{1-26}$ monovalent hydrocarbon groups, e.g., alkyl groups such as the methyl group and ethyl group, the vinyl group, the phenyl group, and so forth. The methyl group, ethyl group, and phenyl group are preferred.

Each may be different, but when UV resistance is required, preferably about 60% of the R in the preceding formula is the methyl group (that is, the number of non-methyl functional groups present with reference to the number of Si (number of moles) is preferably not more than 0.35 (mol)) and more preferably at least 80% of the R in the preceding formula is the methyl group. R may also be a $C_{1-6}$ alkoxy group or the hydroxyl group, but the content of the alkoxy group and hydroxyl group is preferably not more than 10 weight % of the alkenyl group-bearing silicon-containing compound (C1). In addition, n is a positive number that satisfies $1 \leq n < 2$. When this value is greater than or equal to 2, an adequate strength is not obtained for the adhesion between the conductors, e.g., the lead frame, and the material for a molded resin, while synthesis of this polyorganosiloxane becomes quite difficult when this value is less than 1.

The alkenyl group-bearing silicon-containing compound (C1) can be, for example, a vinylsilane or a vinyl group-containing polyorganosiloxane, and a single one of these can be used by itself or two or more may be used in any ratio and combination. A vinyl group-containing polyorganosiloxane having at least two vinyl groups in the molecule is preferred among the preceding.

The following are specific examples of vinyl group-containing polyorganosiloxanes that have at least two vinyl groups in the molecule.

Both-end vinyl-terminated polydimethylsiloxanes DMS-V00, DMS-V03, DMS-V05, DMS-V21, DMS-V22, DMS-V25, DMS-V31, DMS-V33, DMS-V35, DMS-V41, DMS-V42, DMS-V46, and DMS-V52 (all from Gelest, Inc.)

Both-end vinyl-terminated dimethylsiloxane-diphenylsiloxane copolymers
PDV-0325, PDV-0331, PDV-0341, PDV-0346, PDV-0525, PDV-0541, PDV-1625, PDV-1631, PDV-1635, PDV-1641, PDV-2331, and PDV-2335 (all from Gelest, Inc.)

Both-end vinyl-terminated phenylmethylsiloxanes PMV-9925 (from Gelest, Inc.)

trimethylsilyl-end-capped vinylmethylsiloxane-dimethylsiloxane copolymers
VDT-123, VDT-127, VDT-131, VDT-153, VDT-431, VDT-731, and VDT-954 (all from Gelest, Inc.)

vinyl T-structure polymers
VTT-106 and MTV-124 (both from Gelest, Inc.)

The hydrosilyl group-bearing silicon-containing compound (C2) can be, for example, a hydrosilane or a hydrosilyl group-bearing polyorganosiloxane, and a single one of these can be used by itself or two or more may be used in any ratio and combination. A hydrosilyl group-bearing polyorganosiloxane that has at least two hydrosilyl groups in the molecule is preferred here.

The following are specific examples of polyorganosiloxanes that contain at least two hydrosilyl groups in the molecule.

Both-end hydrosilyl-terminated polydimethylsiloxanes DHS-H03, DMS-H11, DMS-H21, DMS-H25, DMS-H31, and DMS-H41 (all from Gelest, Inc.)

trimethylsilyl-both-end-capped methylhydrosiloxane-dimethylsiloxane copolymers
HMS-013, HMS-031, HMS-064, HMS-071, HMS-082, HMS-151, HMS-301, and HMS-501 (all from Gelest, Inc.)

The alkenyl group-bearing silicon compound (C1) and the hydrosilyl group-bearing silicon compound (C1) are used in the present invention in amounts that provide generally 0.5 mol or more, preferably 0.7 mol or more, and more preferably 0.3 mol or more, but generally 4.0 mol or less, preferably 3.0 mol or less, and even more preferably 2.0 mol or less of the hydrosilyl group-bearing silicon compound (C2) (number of moles of the hydrosilyl group) per 1 mole of the alkenyl group-bearing silicon compound (C1) (number of moles of the alkenyl group). Controlling the number of moles of hydrosilyl group with reference to the alkenyl group makes it possible to lower the post-cure amount of unreacted terminal groups and to thereby obtain a cured material that exhibits little timewise variation, e.g., discoloration or delamination, during use as a light source.

The content of reaction sites (crosslinking sites) where hydrosilylation occurs is preferably 0.1 mmol/g or more and 20 mmol/g or less in the resin itself free of the white pigment for both the alkenyl group and hydrosilyl group. 0.2 mmol/g or more and 10 mmol/g or less is more preferred.

Viewed from the standpoint of ease of handling, the viscosity of the resin prior to the addition of the white pigment is generally not more than 100,000 cp and is preferably not more than 20,000 cp and more preferably is not more than 10,000 cp. While there are no particular limitations on the lower limit, it is generally at least 15 cp in view of the relationship with the volatility (boiling point).

The weight-average molecular weight of the resin, as the average molecular weight value measured by gel permeation chromatography using polystyrene as the standard substance for the resin, is preferably 500 or more and 100,000 or less. It is more preferably 700 or more and 50,000 or less, Furthermore, at least 1,000 is even more preferred for the purpose of providing a small volatile component, (in order to maintain the adhesiveness with other articles) and not more than 25,000 is also even more preferred from the standpoint of the ease of handling of the material prior to molding. Not more than 20,000 is most preferred.

<1-1-2. Condensation-Type Polyorganosiloxanes>

The condensation-type polyorganosiloxanes can be exemplified by compounds that have the Si—O—Si bond at the crosslinking sites and are obtained by the hydrolysis/polycondensation of alkylalkoxysilane. Specific examples are the polycondensates obtained by the hydrolysis/polycondensation of compounds represented by the following general formulas (3) and/or (4), and/or their oligomers.

$$M^{m+}X_nY^1_{m-n} \qquad (3)$$

In formula (3), M represents silicon; X represents a hydrolyzable group; $Y^1$ represents a monovalent organic group; m represents an integer greater than or equal to 1 that represents the valence of M; and n represents an integer greater than or equal to 1 that represents the number of X groups. In addition, $m \geq n$.

$$(M^{s+}X_tY^1_{s-t-1})_uY^2 \qquad (4)$$

In formula (4), M represents silicon; X represents a hydrolyzable group; $Y^1$ represents a monovalent organic group; $Y^2$ represents an organic group of valence u; s represents an integer greater than or equal to 1 that represents the valence of M; t represents an integer that is greater than or equal to 1 and less than or equal to s−1; and u represents an integer greater than or equal to 2.

Known condensation-type polyorganosiloxanes can be used; for example, the members for semiconductor light-emitting devices described in Japanese Patent Application Laid-open Nos. 2006-77234, 2006-291018, 2000-316264, 2006-336010, and 2006-348284 and WO 2006/09804 are suitable.

<1-1-2-1. Particularly Preferred Condensation-Type Polyorganosiloxanes>

Particularly preferred materials among the condensation-type polyorganosiloxanes are described in the following.

In the case of use in semiconductor light-emitting devices, polyorganosiloxanes generally exhibit a weak adhesiveness to, for example, the semiconductor light-emitting elements, the substrates on which the semiconductor light-emitting devices are placed, the molded resins, and so forth, and condensation-type polyorganosiloxanes that have at least one of the following characteristics [1] and [2] are preferred in order to provide a polyorganosiloxane that is highly adhesive to the preceding.

[1] The silicon content is at least 20 weight %.

[2] The measured solid-state Si-nuclear magnetic resonance (NMR) spectrum has at least one of the following peaks (a) and/or (b) that originate with Si.

(a) Using the dimethylsiloxy silicon of dimethylsilicone rubber as the reference, a peak for which the position of the peak top is in the region of a chemical shift −40 ppm or more and 0 ppm or less, and for which the peak half-width value is 0.3 ppm or more and 3.0 ppm or less.

(b) Using the dimethylsiloxy silicon of dimethylsilicone rubber as the reference, a peak for which the position of the peak top is in the region of a chemical shift −80 ppm or more and −40 ppm or less, and for which the peak half-width value is 0.3 ppm or more and 5.0 ppm or less.

A condensation-type polyorganosiloxane having characteristic [1] of the preceding characteristics [1] and [2] is preferred in the present invention, while a condensation-type polyorganosiloxane having characteristics [1] and [2] is more preferred.

A condensation-type polyorganosiloxane does produce a liberated component as the condensation reaction progresses, but can be used in those cases in which, depending on the molding method, this component does not have a substantial influence on the moldability. In this case, the silanol content in the condensation-type polyorganosiloxane is particularly preferably 0.01 weight % or more and 10 weight % or less.

<1-2. The White Pigment (B)>

A known pigment that does not interfere with resin curing can be selected as appropriate for the white pigment in the present invention. An inorganic material and/or an organic material can be used for the white pigment. Here, white denotes colorlessness and the absence of transparency. Thus, it refers to the color that can cause the diffuse reflection of incident light by a substance that does not exhibit a specific absorption wavelength in the visible region.

Inorganic particles that can be used as the white pigment can be exemplified by metal oxides seen as alumina, (also referred so below as "finely divided alumina powder" or "aluminum oxide"), silicon oxide, titanium oxide (titania), zinc oxide, magnesium oxide, and so forth; metal salts such as calcium carbonate, barium carbonate, magnesium carbonate, barium sulfate, aluminum hydroxide, calcium hydroxide, magnesium hydroxide, and so forth; as well as boron nitride, alumina white, colloidal silica, aluminum, silicate, zirconium silicate, aluminum borate, clay, talc, kaolin, mica, synthetic mica, and so forth.

Finely divided organic particles that can be used as the white pigment can be exemplified by resin particles such as fluororesin particles, guanamine resin particles, melamine resin particles, acrylic resin particles, silicone resin particles, and so forth, but there is no limitation to any of the preceding. Viewed from the perspective of obtaining a high whiteness, a high light reflection activity even, at small amounts, and resistance to deterioration, alumina, titanium oxide, and zinc oxide are particularly preferred among the preceding. Viewed from the perspective of raising the thermal conductivity of the cured material, alumina and boron nitride are particularly preferred. Alumina is particularly preferred also from the perspective of obtaining a high light reflection action for near-ultraviolet radiation with little deterioration induced by the near-ultraviolet radiation.

A single one of the preceding may be used or a mixture of two or more of the preceding may be used.

When titanium oxide is used, it may be incorporated to a degree that does not bring out the problems with photocatalysis, dispersibility, or whiteness.

The titanium oxide can be specifically exemplified by the TA series and TR series from Fuji Titanium Industry Co., Ltd., and the TTO series, MC series, CR-EL series, PT series, ST series, and FTL series from Ishihara Sangyo Kaisha, Ltd. The alumina can be specifically exemplified by the A30 series. AN aeries, A40 series, MM series, LS series, and AHP series from Nippon Light Metal Co., Ltd.; "Admafine Alumina" type AO-5 and AO-8 from Admatechs Co., Ltd.; the CR series from Baikowski Japan Co., Ltd.; Taimicron from Taimei Chemicals Co., Ltd.; alumina powder with a diameter of 10 μm² from Aldrich; the A-42 series, A-43 series, A-50 series, AS series, AL-43 series, AL-47 series, AL-160SG series, A-170 series, and AL-170 series from Showa Denko Kabushiki Kaisha; and the AM series, AL series, AMS series, AES series, AKP series, and AA series from Sumitomo Chemical Co., Ltd. The zirconia can be specifically exemplified by UEP-100 from Daiichi Kigenso Kagaku Kogyo Co., Ltd. The zinc oxide can be specifically exemplified by JIS grade 1 zinc oxide from HakusuiTech Co., Ltd.

A larger difference between the refractive index of the polyorganosiloxane (A) and the refractive index of the white pigment (B) provides a higher whiteness, even at small amounts of addition of the white pigment, and makes it possible to obtain a better reflection and scattering efficiency for the molded resin for a semiconductor light-emitting device. The polyorganosiloxane (A) preferably has a refractive index of approximately 1.41, and alumina particles having a refractive index of 1.76 are preferably used as the white pigment (B). The refractive index of the polyorganosiloxane (A) is preferably at least 1.40 from the standpoint of the hardness of the resin, but is preferably not more than 1.50 because smaller differences with the refractive index of alumina result in a declining reflectivity and a declining heat resistance.

The white pigment in the present invention is preferably alumina because alumina has a high light reflecting activity for near-ultraviolet radiation and undergoes little near-ultraviolet-induced deterioration. Alumina exhibits a low absorption capacity for ultraviolet radiation and for this reason is well adapted for use in combination with a light-emitting element that emits light in the ultraviolet to near-ultraviolet. In the present invention, alumina denotes the oxide of aluminum, and, while its crystalline form is not critical, α-alumina, which has such properties as a high chemical stability, a high melting point, a high mechanical strength, a high hardness, and a high electrical insulation resistance, is well suited for use.

When alumina is used for the white pigment in the present invention, the crystallite size of the alumina crystals is preferably 500 Å or more and 2,000 Å or less, more preferably 700 Å or more and 1,500 Å or less, and particularly preferably 900 Å or more and 1,300 Å or less. Here, crystallite denotes the largest aggregate that can be regarded as a single crystal.

The primary particle diameter of the alumina being in the range indicated above and the crystallite size of the alumina crystals being in the range indicated above mean that the primary particle size is different from the crystallite size, that is, that a primary particle is composed of a plurality of crystallites.

The crystallite size of the alumina crystals is preferably in the range indicated above because this results in little wear of the piping, screw, mold, and so forth, during molding, and also inhibits the near-induced incorporation of impurities.

The crystallite size can be checked by X-ray diffraction measurements. When the alumina exhibits crystallinity, a peak is generated in the X-ray diffraction measurement at a position determined in conformity to the crystal form. The crystallite diameter (crystallite size) can be calculated according to the Scherrer equation from the half-width value of this peak.

The presence as an impurity of elements other than aluminum and oxygen in the alumina is disfavored as this can lead to coloration due to absorption in the visible light region. For example, when chromium is present, even in trace amounts, this is generally called a ruby and a red color is taken on; when iron or titanium is present as an impurity, this is generally called a sapphire and a blue color is displayed. The alumina used in the present invention preferably has a content of chromium, iron, and titanium of not more than 0.02 weight % each and more preferably not more than 0.01 weight % each.

As noted above, a higher thermal conductivity for the cured material is preferred for the material of the present invention for a molded resin, and the use of at least 98% pure alumina is preferred for raising the thermal conductivity while the use of at least 99% pure alumina is more preferred and the use of low soda alumina is particularly preferred. The use of boron nitride is also preferred for raising the thermal conductivity, and the use of at least 99% pure boron nitride is particularly preferred.

Titanium oxide can also be suitably used as the white pigment in particular in semiconductor light-emitting devices that use a light-emitting element that has a peak light emission wavelength at 420 nm or greater. While titanium oxide (titania) does have the ability to absorb ultraviolet radiation, due to its large refractive index and strong light scattering ability it has a high reflectivity for light at wavelengths of 420 nm and above and readily exhibits strong reflection even at small amounts of addition. The rutile type is preferred for the white pigment of the present invention because it is more stable at high temperatures, has a higher refractive index, and has a relatively higher light resistance than the anatase type, which is unstable at high temperatures and exhibits a large capacity to absorb ultraviolet radiation and a high photocatalytic activity. The use of rutile type that has been surface-coated with a thin film of silica or alumina is particularly preferred with the goal of restraining the photoactivity.

Alumina and titanium oxide may be used in combination since titanium oxide has a high refractive index and thus provides a large refractive index difference from polyorganosiloxanes and therefore readily provides strong reflection even at small amounts of addition. For example, they can be mixed in proportions that yield a weight ratio of titanium oxide versus alumina (alumina:titanium oxide) of 50:50 to 95:5. The addition of a small amount of titanium oxide to the alumina has the potential to raise the reflectivity for light at wavelengths of 420 nm and greater over that for the use of alumina by itself and also tends to restrain the decline in the reflectivity in the case of small proportions of the white pigment in the material and in the case of a thin material. The co-use of titania makes it possible to use the white pigment in smaller proportions in the material, which results in greater freedom in the formulation of the material composition and makes it possible to raise the amount of loading with components other than the white pigment. A higher reflectivity by the thin material is very advantageous in terms of raising the degree of freedom for the shape of the molded resin. Moreover, a high reflectivity for the material even where a large thickness is not possible, as in the case of thin molded resins and fine-structured molded resins, can be expected to have the effect of increasing the brightness of the semiconductor light-emitting device.

A surface treatment may be carried out on the white pigment using, for example, a silane coupling agent. The hardness of the molded resin material as a whole can be improved when a white pigment is used that has been surface-treated with a silane coupling agent.

<1-2-1. Preferred Shapes for the White Pigment (A)>

The primary particles of the white pigment (B) characteristically have an aspect ratio 1.2 or more and 4.0 or less in the present invention.

The aspect ratio of the white pigment (B) is preferably at least 1.25, more preferably at least 1.3, and even more preferably at least 1.4. The upper limit, on the other hand, is preferably not more than 3.0, more preferably not more than 2.5, even more preferably not more than 2.2, particularly preferably not more than 2.0, and most preferably not more than 1.8.

When the aspect ratio is in the range indicated above, a high reflectivity due to scattering is readily manifested and in particular a large reflection is obtained for the short wavelength light of one near-ultraviolet region. This results in an improved LED output for a semiconductor light-emitting device that uses the molded resin under consideration.

The use of a white pigment having an aspect ratio in the above-indicated range is also preferred in terms of the moldability, i.e., a low mold wear is obtained. When the aspect ratio is larger than the above-indicated range, severe mold wear may occur due to contact with the angular regions of the pigment particles. Conversely, when a white pigment is used that has a smaller aspect ratio, mold wear is again prone to occur because the frequency of contact between the mold and pigment is increased due to an increase in the packing density of the pigment in the material. Furthermore, the viscosity of the material can be easily adjusted when a white pigment having an aspect ratio in the above-indicated range is used, and adjustment to a viscosity favorable for molding can provide a material with an excellent moldability, i.e., the molding cycle can be shortened and flashing can be inhibited.

When, in particular, the aspect ratio is larger than 4.0, it is then difficult to obtain strong reflection; wear of the plumbing, screw, mold, and so forth, will readily occur during molding; and, due to the incorporation of impurities caused by the wear, the molded resin product is prone to have a reduced reflectivity and is also readily susceptible to dielectric breakdown.

The aspect ratio is generally used as a convenient method for quantitatively expressing the shape of, for example, a particle, and is determined in the present invention by dividing the length of the major axis (the largest long diameter) of a particle, as measured by observation with an electron microscope, e.g., with an SEM, by the length of the minor axis (the length of the longest part in the direction perpendicular to the long diameter). In the event of scatter or variation in the length of an axis, a plurality of points (10 points, for example) can be measured by SEM and the length of the axis can be determined from their average value. Or, by measuring 30 points or 100 points the same result can be obtained from the calculation.

The aspect ratio is an index to whether the shape of the particle is fibrillar or rod-like or is spherical, and a particle with a fibrillar shape has a large aspect ratio while a spherical particle has an aspect ratio of 1.0.

By having the aspect ratio be in the range indicated above, the present invention excludes spherical and perfectly spherical shapes from the shapes preferred for the white pigment (B). In addition, highly elongated shapes, because they instead cause a lowering of the reflectivity, are also excluded from the white pigment (B) according to the present invention. When the aspect ratio is in the range indicated above, the white pigment tends to block clearances in the mold and thereby inhibits the occurrence of flashing; with a spherical shape, however, clearances in the mold are traversed and flashing tends to occur easily.

In the present invention, particles having an aspect ratio encompassed by the previously indicated range preferably account for at least 60 volume %, more preferably at least 70 volume %, and particularly preferably at least 80 volume % of the white pigment (B) as a whole. The individual skilled in the art will naturally understand that this is not a case where the entire white pigment (B) must necessarily satisfy the aspect ratio range indicated above.

Ordinary methods, e.g., grinding and/or subjecting the white pigment to a surface treatment, may be used to bring the aspect ratio into the range indicated above. This can also be achieved by microfine-sizing by grinding (pulverizing) the white pigment and/or by producing the white pigment by calcination.

With regard to chemical composition, the white pigment (B) in the present invention encompasses the finely divided inorganic particles/finely divided organic particles provided above as examples in 1-2. In addition, its shape is preferably a (c) crushed shape.

This (c) crushed shape denotes the shape provided when the white pigment is microfine-sized mainly by grinding (pulverization) and also includes shapes—as provided by a post-grinding treatment—that somewhat take on a roundness having small crystal angles, as well as the nonspherical pigment shapes produced by, for example, calcination. Thus, the intent is to exclude, from the standpoint of the nature of the production process, white pigment formed with a spherical or perfectly spherical shape. The material that uses a white pigment having a crushed shape more readily exhibits a high scattering-induced reflectivity than does the material that uses a spherical white pigment and in particular exhibits greater reflection of the short wavelength light in the near-ultraviolet region (particularly light with a wavelength of 360 nm to 460 nm). It can also be more favorable from an economic standpoint than a spherical pigment. The LED output can thus be improved based on the preceding in a semiconductor light-emitting device that uses the molded resin under consideration.

The primary particle diameter of the white pigment (B) is preferably 0.1 µm or more and 2 µm or less in the present invention. The value of the lower limit is preferably at least 0.15 µm, more preferably at least 0.2 µm, and particularly preferably at lease 0.25 µm, while the value of the upper limit is preferably not more than 1 µm, more preferably not more than 0.8 µm, and particularly preferably not more than 0.5 µm.

When the primary particle diameter is in the above-indicated range, the material can readily exhibit a high reflectivity because it combines the scattered light intensity with a back-scattering tendency and in particular strongly reflects short wavelength light, e.g., in the near-ultraviolet region, and is thus preferred.

When the primary particle diameter of the white pigment is too small, the scattered light intensity is low and as a consequence the reflectivity tends to be low; when the primary particle diameter is too large, the scattered light intensity is high, but the reflectivity tends to be small due to the appearance of a forward scattering tendency.

A primary particle diameter in the above-indicated range is also preferred from the standpoint of the moldability, e.g., facile adjustment to a viscosity suitable for molding, low mold wear, and so forth. When the primary particle diameter exceeds the range given above, contact with the pigment particles subjects the mold to a large impact and substantial mold wear then tends to occur. When a white pigment is used that has a primary particle diameter below the range given above, the material readily assumes a high viscosity and the loading volume by the white pigment cannot be raised, and as a result, it tends to be difficult to achieve a balance between the moldability and the properties of the material, e.g., high reflection.

In particular, the material must be provided with at least a certain degree of thixotropic nature in order to yield a material suitable for use in liquid injection molding. A white pigment with a primary particle diameter 0.1 µm or more and 2.0 µm or less has a substantial ability to impart thixotropic nature when added to the composition, and the viscosity and thixotropic nature can then be easily adjusted to provide an easy-to-mold composition that exhibits little flashing or short molding.

A combination with a white pigment having a primary particle diameter larger than 2 µm can also be used in order, for example, to raise the filling rate for the white pigment in the resin composition.

The primary particle referenced by the present invention is the smallest solid unit that can be clearly separated from among the other particles that make up a powder, and the primary particle diameter denotes the particle diameter of a primary particle as measured by observation with an electron microscope, e.g., an SEM. A secondary particle, on the other hand, refers to an aggregated particle formed by the aggregation of primary particles, and the median diameter of the secondary particles refers to the particle diameter measured using, for example, a particle distribution analyzer, with the powder dispersed in a suitable dispersing medium (for example, water in the case of alumina). When there is scatter in the primary particle diameter, the SEM observation can be performed at several points (for example, 10 points) and the average value thereof can be determined and used as the particle diameter. When a particular particle diameter is nonspherical in the measurement, the longest length, i.e., the length of the major axis, is used for the particle diameter.

The aspect ratio and primary particle diameter of the white pigment can be measured even after molding (post-curing). A cross section of the molded product can be observed with an electron microscope, e.g., with an SEM, and the primary particle diameter and aspect ratio can be measured on the white pigment exposed in the cross section.

This is determined in the present invention by dividing the length of the major axis (the largest long diameter) of a particle, as measured by observation with an electron microscope, e.g., with an SEM, by the length of the minor axis (the length of the longest part in the direction perpendicular to the long diameter). In the event of scatter or variation in the length of an axis, a plurality of points (10 points, for example) can be measured by SEM and the length of the axis can be determined from their average value. Or, 30 points or 100 points can be measured and the result can be used from the same calculation.

The median diameter of the secondary particles (also referred to below as the "secondary particle diameter") of the aforementioned white pigment is preferably at least 0.2 µm and more preferably at least 0.3 µm. The upper limit is preferably not more than 10 µm, more preferably not more than 5 µm, and even more preferably not more than 2 µm.

A preferred material in terms of moldability can be readily obtained when the secondary particle diameter is in the above-indicated range. In addition, adjustment to a viscosity suitable for molding can be easily carried out and there is little mold wear. Moreover, the appearance of flashing is inhibited, because the ability of the white pigment to pass through clearances in the mold is inhibited, and the occurrence of problems during molding is inhibited because mold gate clogging is inhibited. When the secondary particle diameter exceeds the above-indicated range, the material tends to become nonuniform due to sedimentation of the white pigment and the moldability is impaired due to mold, wear and gate clogging and the uniformity of reflection by the material is impaired.

A combination with a white pigment having a secondary particle diameter larger than 10 μm can also be used in order, for example, to raise the filling rate for the white pigment in the resin composition. The median diameter refers to the particle diameter at the point where the volume based particle size distribution curve in cumulative % intersects with the horizontal axis at 50% and is typically referred to as the 50% particle diameter ($D_{50}$) or the median diameter.

The ratio y/x of the median diameter y of the secondary particles to the primary particle diameter x of the white pigment (B) is generally at least 1 in the present invention and is preferably larger than 1 and more preferably is at least 1.2, and is generally not more than 10 and preferably not more than 5.

By having the ratio y/x of the median diameter y of the secondary particles to the primary particle diameter x be in the above-indicated range, white pigment formed in a spherical or perfectly spherical shape (that is, there is almost no aggregation of primary particles and the primary particle diameter and the median diameter of the secondary particles are approximately equal) is excluded from the preferred shapes for the white pigment (B).

Then the ratio y/x of the median diameter y of the secondary particles to the primary particle diameter x is in the above-indicated range, a high reflectivity is readily manifested due to scattering and in particular short wavelength light in the near-ultraviolet region is substantially reflected. This makes it possible to raise the LED output in a semiconductor light-emitting device that uses the molded resin under consideration. Moreover, adjustment to a material viscosity suitable for molding is also easily carried out.

<1-2-2. The Amount of Addition for the White Pigment (B)>

The content of the white pigment (B) in the molded resin material for a semiconductor light-emitting device in the present invention is selected as appropriate as a function of the particle diameter and type of the pigment used and the difference between the refractive indexes of the polyorganosiloxane and pigment. Expressed with respect to 100 weight parts of the polyorganosiloxane (A), the content of the white pigment (B) is generally at least 20 weight parts, preferably at least 50 weight parts, and more preferably at least 100 weight parts and is generally not more than 900 weight parts, preferably not more than 600 weight parts, and more preferably not more than 400 weight parts.

An excellent reflectivity and moldability are obtained within the above-indicated range. At below the lower limit indicated above, light transmission tends to occur and the reflection efficiency of the semiconductor light-emitting devise tends to decline. At above the upper limit, the moldability tends to decline due a deterioration in the fluidity of the material.

In particular, the material must be provided, with at least a certain degree of thixotropic nature in order to yield a material suitable for use in liquid injection molding. When a white pigment with a primary particle diameter 0.1 μm or more and 2.0 μm or less is incorporated in the composition, a substantial increasing viscosity occurs and a large thixotropic nature imparting effect is obtained. The incorporation of at least 30 weight %, with reference to the composition as a whole, of a white pigment with such a shape can provide an easily moldable material that exhibits little flashing or short molding and also facilitates adjustment of the viscosity and thixotropic nature.

In order, in addition, to control the thermal conductivity of the material for a molded resin into the range 0.4 or more and 3.0 or less, vide infra, the addition is preferred, expressed with reference to the total weight of the material for a molded resin, of 40 weight parts or more and 90 weight parts or less of alumina as the white pigment (B). Or, the addition is preferred, expressed with reference to the total weight of the material for a molded resin, of 30 weight parts or more and 30 weight parts or less of boron nitride as the white pigment (B). Alumina and boron nitride may also be used in combination.

<1-3. The Curing Catalyst (C)>

The curing catalyst (C) in the present invention is a catalyst that cures the polyorganosiloxane (A). The polyorganosiloxane cures with the polymerization reaction being accelerated by the catalyst. This catalyst is an addition polymerization catalyst or a polycondensation catalyst depending on the curing mechanism for the polyorganosiloxane.

The addition polymerization catalyst is a catalyst for accelerating the hydrosilylation addition reaction between the alkenyl group in component (C1) and the hydrosilyl group in component (C2), and this addition polymerization catalyst can be exemplified by platinum group metal catalysts such as platinum-based catalysts, e.g., platinum black, platinic chloride, chloroplatinic acid, the reaction product of chloroplatinic acid and a monohydric alcohol, a chloroplatinic acid/olefin complex, and platinum bisacetoacetate; palladium-based catalysts; and rhodium-based catalysts. The amount of incorporation of this addition polymerization catalyst (C3) can be a catalytic amount, and, expressed as the platinum group metal with reference to the total weight of (C1) and (C2), is generally at least 1 ppm and preferably at least 2 ppm and generally is not more than 100 ppm, preferably not more than 50 ppm, and more preferably not more than 20 ppm. Operating in accordance with the preceding can provide a high catalytic activity.

An acid such as hydrochloric acid, nitric acid, sulfuric acid, or an organic acid, or an alkali such as ammonia or an amine, or a metal chelate compound can as used as the polycondensation catalyst, and a metal chelate compound containing at least one selection from Ti, Ta, Zr, Al, Hf, Zn, Sn, and Pt can be favorably used as the polycondensation catalyst. Among the preceding, the metal chelate compound preferably contains at least one selection from Ti, Al, Zn, and Zr, wherein the use of a metal chelate compound that contains Zr is more preferred.

These catalysts are selected considering the stability when incorporated in the molded resin material for a semiconductor light-emitting device, the film hardness, the nonyellowing performance, and the curability.

The amount of incorporation of the polycondensation catalyst, expressed with reference to the total weight of the components represented by formula (3) and/or (4) above, is generally at least 0.01 weight % and preferably at least 0.05 weight %, while the upper limit is generally not more than 10 weight % and preferably not more than 0 weight %.

When the amount of addition is in the range given above, the molded resin material for a semiconductor light-emitting device has an excellent curability and storage stability and the quality of the molded resin product is also excellent. Problems may appear with the storage stability of the molded resin material when the amount of addition exceeds the upper limit value. At below the lower limit value, long curing times are encountered and the molded resin productivity declines and there is also a tendency for the quality of the molded resin to be reduced due to uncured components.

<1-4. The Cure Rate Controlling Agent (D)>

The material of the present invention for a molded resin for a semiconductor light-emitting device preferably also contains a cure rate controlling agent (D). This cure rate controlling agent is used to control the cure rate during molding of the molded resin material in order to improve its molding efficiency and can be exemplified by retarders and hardening accelerators.

The retarders can be exemplified by compounds that contain an a aliphatically unsaturated bond, organophosphorus compounds, organosulfur compounds, nitrogenous compounds, tin compounds, organoperoxides, and so forth, and these may be used in combination.

The compounds that contain an aliphatically unsaturated bond can be exemplified by propargyl alcohols such as 3-hydroxy-3-methyl-1-butyne, 3-hydroxy-3-phenyl-1-butyne, and 1-ethynyl-1-cyclohexanol; ene-yne compounds; and maleic acid esters such as dimethyl maleate. Compounds that contain a triple bond are preferred among these compounds containing an aliphatically unsaturated bond. The organophosphorus compounds can be exemplified by triorganophosphines, diorganophosphines, organophosphines, and triorganophosphites. The organosulfur compounds can be exemplified by organomercaptans, diorgano sulfides, hydrogen sulfide, benzothiazole, thiazole, and benzothiazole disulfide. The nitrogenous compounds can be exemplified by ammonia, primary to tertiary alkylamines, arylamines, urea, and hydrazine. The tin compounds can be exemplified by stannous halide dihydrates and stannous carboxylates. The organoperoxides can be exemplified by di-t-butyl peroxide, dicumyl peroxide, benzoyl peroxide, and t-butyl perbenzoate.

Among the retarders given above, benzothiazole, thiazole, dimethyl maleate, 3-hydroxy-3-methyl-1-butyne, and 1-ethynyl-1-cyclohexanol are preferred for their excellent retardation activity and ease of reagent acquisition.

Various amounts of addition can be set for the retarder, but, expressed per 1 mol of the curing catalyst (C) used, the lower limit on the amount of addition is preferably at least $10^{-1}$ mol and more preferably at least 1 mol and the upper limit on the amount of addition is preferably not more than $10^3$ mol and more preferably not more than 50 mol. A single one of these retarders may be used or two or more may be used in combination.

There are no particular limitations on the hardening accelerator other than that it have the ability to cure the heat-curable resin, and the hardening accelerator can be exemplified by imidazoles, dicyandiamide derivatives, dicarboxylic acid dihydrazides, triphenylphosphine, tetraphenylphosphonium tetraphenylborate, 2-ethyl-4-methylimidazole tetraphenylborate, and 1,8-diazabicyclo[5.4.0]undecene-7-tetraphenylborate. The use of the imidazoles is preferred among the preceding because they exhibit a high reaction-promoting activity.

The imidazoles can be exemplified by 2-methylimidazole, 2-ethyl-4-methylimidazole, 1-cyanoethyl-2-phenylimidazole, and 1-cyanoethyl-2-phenylimidazolium trimellitate, and are available under the product names 2E4MZ, 2PZ-CN, and 2PZ-CNS (Shikoku Chemicals Corporation). The amount of addition of the hardening accelerator is preferably 0.1 weight part or more and 10 weight parts or less per 100 weight parts of the total of the heat-curable polyorganosiloxane resin (A) and the curing catalyst (C).

The specification of the type and amount of incorporation of the cure rate controlling agent as indicated above makes it easy to mold the material for a molded resin. For example, advantages accrue such as providing a high mold filling ratio, eliminating leakage from the mold during molding by injection molding, and providing resistance to flashing.

<1-5. Other Components>

Insofar as the essential features of the present invention are not impaired, the material for a molded resin for a semiconductor device may optionally contain, in any proportion, and any combination, one or two or more components other than the polyorganosiloxane (A), white pigment (B), curing catalyst (C), and cure rate controlling agent (D).

For example, solid particles can be incorporated as a fluidity controlling agent (E) with the objective of controlling the sedimentation of the white pigment and/or controlling the fluidity of the material for a molded resin for a semiconductor light-emitting device. The fluidity controlling agent (E) should be a particle that is solid from normal temperature to around the molding temperature and that through its incorporation provides a higher viscosity for the material for a molded resin, but is not otherwise particularly limited. However, it preferably has no ability, or only a very small ability, to absorb light from the light-emitting element or light at a phosphor-converted wavelength, does not significantly lower the reflectivity of the material, and is very durable and exhibits little light- or heat-induced discoloration or degradation. Specific examples are finely divided silica particles, quartz beads, glass beads, inorganic fibers such as glass fibers boron nitride, and aluminum nitride. Moreover, a white pigment that does not satisfy one of the following characteristics (a) and (b), or that satisfies neither of them, such as a fibrous alumina, can be incorporated separately from the white pigment already described above.

(a) The primary particle aspect ratio is 1.2 or more and 4.0 or less.

(b) The primary particle diameter is 0.1 μm or more and 2.0 μm or less.

Finely divided silica particles, which have a significant ability to impart thixotropic nature, are preferred for use among the preceding because they provide facile control of the viscosity and thixotropic nature of the composition. Quartz beads, glass beads, and glass fiber are preferred not only because they can function as a fluidity controlling agent, but also because they can be expected to raise the strength and toughness of the post-theromset material and to lower the linear expansion coefficient of the material, and they may be used alone or in combination with finely divided silica particles.

There are no particular limitations on the finely divided silica particles used by the present invention, but they will have a specific surface area by the BET method generally of at least 30 m$^2$/g, preferably at least 50 m$^2$/g, and more preferably at lease 100 m$^2$/g, and generally not more than 300 m$^2$/g and preferably not more than 200 m$^2$/g. When the specific surface area is too small, no effect is seen from the addition of the finely divided silica particles; when the specific surface area is too large, it becomes very difficult to effect dispersion in the resin. Finely divided silica particles may be used that have been subjected to a surface hydrophobicization by, for example, reacting a surface modifier with the silanol groups that are present on the surface of the hydrophilic finely divided silica particles.

The surface modifier can be exemplified by alkylsilane compounds and specifically by dimethyldichlorosilane, hexamethyldisilazane, octylsilane, and dimethylsilicone oil.

The finely divided silica particles can be exemplified by fumed silica. Fumed silica is produced by the oxidation and hydrolysis of SiCl$_4$ gas in an 1100 to 1400° C. flame provided by the combustion of a mixed gas of H$_2$ and O$_2$. The primary particles in fumed silica are spherical ultrafine particles that have an average particle diameter of about 5 to 50 nm and that have amorphous silicon dioxide ($SiO_2$) as their main component; these primary particles aggregate with each other to form secondary particles having a particle diameter of several hundred nanometers. Fumed silica, because it is an ultrafine particulate and is produced by quenching, has a surface structure that is in a chemically active state.

"Aerosil" (registered trademark) from Nippon Aerosil Co., Ltd., is a specific example, and examples of hydrophilic Aerosil (registered trademark) are "90", "130", "150", "200", and "300", while examples of hydrophobic Aerosil (registered trademark) are "RX50", "NAX50", "NY90G", "RY50", "NY50", "R8200", "R972", "R972V", "R972CF", "R974", "R202", "R805", "R812", "R812S", "RY200", "RY200S", and "RX200".

A polyorganosiloxane that functions as a liquid increasing viscosity agent may be incorporated as a portion of the polyorganosiloxane (A) in order to adjust the viscosity of the material for a molded resin. The following can be incorporated as a liquid increasing viscosity agent; a straight-chain polyorganosiloxane that has a viscosity at 25° C. generally 0.001 Pa·s or more and 3 Pa·s or less, preferably 0.001 Pa·s or more and 1 Pa·s or less, and more preferably 0.001 Pa·s or more and 0.7 Pa·s or less, that has a hydroxyl value generally of from $1.0 \times 10^{-2}$ to $10.3 \times 10^{-5}$ mol/g, preferably from $1.0 \times 10^{-2}$ to $9.5 \times 10^{-5}$ mol/g, and more preferably from $1.0 \times 10^{-2}$ to $7.7 \times 10^{-5}$ mol/g, and that has at least one silicon-bonded hydroxyl group (i.e., the silanol group) in each molecule.

This hydroxyl group-containing straight-chain organopolysiloxane used as a liquid increasing viscosity agent should not contain a functional group that participates in the hydrosilylation addition reaction, e.g., an alkenyl group and/or the SiH group, in the molecule, and the hydroxyl group present in the molecule may be bonded to the silicon at the molecular chain terminals, or may be bonded to the silicon in nonterminal position on the molecular chain (i.e., along the molecular chain), or may be bonded in both positions. A straight-chain organopolysiloxane containing the hydroxyl group bonded to the silicon at both molecular chain terminals (that is, an α,ω-dihydroxydiorganopolysiloxane) is preferred.

The silicon-bonded organic groups here can be exemplified by monovalent hydrocarbon groups such as alkyl groups, e.g., methyl, ethyl, propyl, and so forth, and aryl groups, e.g., the phenyl group and so forth. The diorganosiloxane repeat unit constituting the main chain of the organopolysiloxane under consideration is preferably a single selection or a combination of two or more selections from the dimethylsiloxane unit, diphenylsiloxane unit, methylphenylsiloxane unit, and so forth. Specific examples are α,ω-dihydroxydimethylpolysiloxane, α,ω-dihydroxydiphenylpolysiloxane, α,ω-dihydroxyaxathylphenylpolysiloxane, α,ω-dihydroxy(dimethylsiloxane/diphenylsiloxane) copolymer, and α,ω-dihydroxy(dimethylsiloxane/methylphenylsiloxane) copolymer.

The amount of incorporation of the polyorganosiloxane functioning as a liquid increasing viscosity agent, expressed per 100 weight parts of the entire polyorganosiloxane (A), is generally 0 to 10 weight parts, preferably 0.1 to 5 weight parts, and more preferably approximately 0.6 to 3 weight parts.

An inorganic fiber, e.g., glass fiber, may be incorporated with the objective of raising the strength and toughness of the post-thermosetting material. For example, boron nitride, aluminum nitride, or fibrous alumina, which have high thermal conductivities, may be incorporated separately from the white pigment already described above in order to raise the thermal conductivity. In addition, quartz beads, glass beads, and so forth, may be incorporated with the objective of lowering the linear expansion coefficient of the cured material.

When these are added, the intended effect is not obtained when their amount of incorporation is too low, while an amount of incorporation that is too large raises the viscosity of the material for a molded resin for a semiconductor light-emitting device and thus affects the processability. For these reasons, their amount of incorporation should be selected as appropriate from within a range where a satisfactory effect is developed and the processability of the material is not impaired. This is generally not more than 500 weight parts and preferably not more than 200 weight parts per 100 weight parts of the polyorganosiloxane.

The following, for example, may also be incorporated, in a range that does not impair the effects and objects of the present invention, in the aforementioned material for a molded resin: an ion migration (electrochemical migration) inhibitor, ageing inhibitor, radical inhibitor, ultraviolet absorber, adhesion promoter, flame retardant, surfactant, storage stabilizer, ozone degradation inhibitor, photostabilizer, increasing viscosity agent, plasticizer, coupling agent, oxidation inhibitor, heat stabilizer, agent that provides electroconductivity, static inhibitor, radiation-blocking agent, nucleating agent, phosphorus-based peroxide decomposer, lubricant, pigment, metal, inactivator, and property controlling agent.

Silane coupling agents are an example of the coupling agent. The silane coupling agent should contain in each molecule at least one hydrolyzable silicon group and at least one functional group reactive with organic groups, but is not otherwise particularly limited. Considered from the standpoint of the handling characteristics, the group reactive with organic groups is preferably at least one functional group selected from the epoxy group, methacryl group, acryl group, isocyanate group, isocyanurate group, vinyl group, and carbamate group, while considered from the standpoint of the curability and adhesiveness the epoxy group, methacryl group, and acryl group are particularly preferred. Considered from the standpoint of the handling characteristics, the hydrolyzable silicon group is preferably an alkoxysilyl group, while the methoxysilyl group and ethoxysilyl group are particularly preferred in terms of reactivity.

Examples of preferred silane coupling agents are alkoxysilanes having the epoxy functional group, e.g., 3-glycidoxypropyltrimethoxysilane, 3-glycidoxypropyltriethoxysilane, 2-(3,4-epoxycyclohexyl)ethyltrimethoxysilane, and 2-(3,4-epoxycyclohexyl)ethyltriethoxysilane, and alkoxysilanes bearing the methacryl group or acryl group, e.g., 3-methacryloxypropyltrimethoxysilane, 2-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane, and acryloxymethyltriethoxysilane.

The preferred contents of the previously described components (A) to (E) in the material of the present invention for a molded resin for a semiconductor light-emitting device are as follows.

The content of the polyorganosiloxane (A) in the material of the present invention for a molded resist should generally be in a range that enables use as a material for a molded resin, but is not otherwise limited, and, expressed with reference to the material as a whole, is generally 10 weight % or more and 50 weight % or less, preferably 15 weight % or more and 40 weight % or less, and more preferably 20 weight % or more and 35 weight % or less. When the cure rate controlling agent (D) and liquid increasing viscosity agent, which is an additional component, present in the material are polyorganosiloxanes, they are included in the content of (A).

The content of the white pigment (B) in the material of the present invention for a molded resin should generally be in a range that enables use as a material for a molded resin, but is not otherwise limited, and, expressed with reference to the material as a whole, is generally from 30 weight % or more and 85 weight % or less, preferably 40 weight % or more and 80 weight % or less, and more preferably 45 weight % or more and 70 weight % or less in case of that alumina is used as the white pigment (B).

The content of the fluidity controlling agent (E) in the material of the present invention for a molded resin should be in a range that does not impair the effects of the present invention, but is not otherwise limited, and, expressed with reference to the material as a whole, is generally not more than 60 weight %, preferably 2 weight % or more and 70 weight % or less, and more preferably 5 weight % or more and 60 weight % or less.

The ratio of the total amount of the white pigment (B) and fluidity controlling agent (E) to the molded resin material as a whole is preferably at least 50 weight %, more preferably at least 60 weight %, and particularly preferably at least 55 weight %, and is preferably not more than 85 weight % and more preferably not more then 80 weight %.

<1-6. The Viscosity of the Material for a Molded Resin>

The material of the present invention for a molded resin for a semiconductor light-emitting device preferably has a viscosity at 25° C. and a shear rate of 100 $s^{-1}$ of 10 Pa·s or more and 10,000 Pa·s or less. Viewed from the perspective of the molding efficiency during molding of the molded resin for a semiconductor device, this viscosity is more preferably 50 Pa·s or more and 5,000 Pa·s or less, even more preferably 100 Pa·s or more and 2,000 Pa·s or less, and particularly preferably 150 Pa·s or more and 1,000 Pa·s or less.

In addition, viewed from the standpoint of the thixotropic nature, as discussed below, the material of the present invention for a molded resin for a semiconductor light-emitting device has a ratio (1 $s^{-1}$/100 $s^{-1}$) of the viscosity at 25° C. and a shear rate of 1 $s^{-1}$ to the viscosity at 25° C. and a shear rate of 100 $s^{-1}$ preferably of at least 15, more preferably of at least 20, and particularly preferably of at least 30. The upper limit, on the other hand, is preferably not more than 500 and more preferably not more than 300.

In addition, the material of the present invention for a molded resin for a semiconductor light-emitting device particularly preferably has a viscosity at 25° C. and a shear rate of 100 $s^{-1}$ of not more than 1,000 Pa·s and a ratio (1 $s^{-1}$/100 $s^{-1}$) of the viscosity at 25° C. and a shear rate of 1 $s^{-1}$ to the viscosity at 25° C. and a shear rate of 100 $s^{-1}$ of at least 15.

In order to provide a material that exhibits a good moldability, the material must be endowed with a certain degree of thixotropic nature, and when the viscosity at 25° C. and a shear rate of 100 $s^{-1}$ is 10 Pa·s or more and 10,000 Pa·s or less, and the ratio of the viscosity at a shear rate of 1 $s^{-1}$ to the viscosity at a shear rate of 100 $s^{-1}$ is at least 15, a material is provided that exhibits little flashing and short molding (incomplete filling), that supports a shortening of the molding cycle and the total time for the material in molding, and that has a high molding efficiency and facilitates stable molding.

Particularly in the case of LIM molding, which uses a liquid resin material, flashing easily occurs caused by material oozing out from very small clearances in the mold, and this has necessitated a post-processing step to remove the flash. Another problem, on the other hand, has been the easy occurrence of short molding (incomplete filling) when the clearances in the mold are reduced in size in order to inhibit the occurrence of flashing. These problems can be solved when the viscosity of the material for a molded resin is in the range indicated above, and the LIM molding of the molded resin can then be easily carried out with a good moldability. When the viscosity at a shear rate of 100 $s^{-1}$ exceeds 10,000 Pa·s, mold filling becomes unsatisfactory because the resin exhibits poor flow and the molding cycle during injection molding is lengthened due to the time required for material feed, and the molding efficiency thus tends to decline. When this viscosity is less than 10 Pa·s, flashing is produced because the material leaks from clearances in the mold and it is also difficult to carry out stable molding because the injection pressure readily escapes through clearances in the mold, and the molding efficiency thus tends to decline. Particularly in the case of small moldings, the post-processing required to remove flash becomes quite problematic and preventing flashing then becomes critical for the moldability.

When the ratio of the viscosity at 25° C. and a shear rate of 1 $s^{-1}$ to the viscosity at 25° C. and a shear rate of 100 $s^{-1}$ is less than 15, i.e., when the viscosity at a shear rate of 1 $s^{-1}$ is relatively small, controlling molding can be problematic for the following reasons: the material also easily penetrates into clearances in the molding device and the mold and flashing is very prone to occur; dripping from the nozzle readily occurs; and it is difficult to transmit the injection pressure to the material, which impedes the stable execution of molding. While resin leakage at the parting line of the sprue tends to be a problem in LIM molding, the adjustment into the viscosity range of the present invention also has the effect of preventing this resin leakage.

This viscosity at 25° C. and a shear rate of 100 $s^{-1}$ and viscosity at 25° C. and a shear rate of 1 $s^{-1}$ can be measured using, for example, an ARES-G2 strain-controlled rheometer (from TA Instruments Japan Inc.).

A certain degree of thixotropic nature must be imparted to the material in order to control the aforementioned viscosity and provide a material suitable for use in liquid injection molding (LIM molding). A substantial increasing viscosity occurs and a large thixotropic nature imparting effect is obtained when finely divided particles in the microscopic range (primary particle diameter 0.1 μm or more and 2.0 μm or less) are incorporated in the material. As a consequence, the thixotropic nature of the composition is easily controlled when a white pigment (B) having a primary particle diameter 0.1 μm or more and 2.0 μm or less is used and/or when a fluidity controlling agent (E) in the microscopic range, such as fumed silica with its large specific surface area, is used. Specifically, the incorporation is preferred of at least 10 weight % of the white pigment (B) having a primary particle diameter 0.1 μm or more and 2.0 μm or less, while the viscosity of the material can be controlled into the previously indicated range even more preferably by the incorporation of the combination of the white pigment (B) with a fluidity controlling agent (E) that is not a white pigment, such as a fumed silica or quartz beads, at a total of 50 to 85 weight % for the combination.

When a white pigment is used that has a median diameter for the secondary particles greater than 2 μm, and particularly when a white pigment is used that has a median diameter of at least 5 μm, it is preferably used in combination with a fluidity controlling agent in the microscopic range with its large thixotropic nature imparting effect. However, when the primary particle diameter of the white pigment (B) itself is sufficiently small, it will also be possible to use only the white pigment without the combination with a fluidity controlling agent, or it may be combined with a fluidity controlling agent that has a relatively large median diameter of several micrometers or more.

<1-7. The Thermal Conductivity of the Material for a Molded Resin>

The material of the present invention for a molded resin for a semiconductor light-emitting device has a thermal conductivity when cured preferably 0.4 or more and 1.0 or less, and more preferably 0.6 or more and 2.0 or less. The thermal conductivity when cured can be measured using, for example, an ai-Phase Mobile (from the ai-Phase Co., Ltd.).

Here, "when cured" refers to the execution of thermosetting for 4 minutes at 180° C.

Heat is produced in a semiconductor light-emitting device by the light that is emitted from the semiconductor light-emitting element, and larger amounts of heat are generated in particular in the case of high-output elements. In such cases, the phosphor layer adjacent to the molded resin undergoes heat-induced deterioration and the durability of the device is ultimately diminished.

With respect to this problem, the present inventors discovered that by having the thermal conductivity when cured, i.e., when the molded resin has been made by molding, be in the previously indicated range, the thermal radiation characteristics for the heat generated by the light emitted from the semiconductor light-emitting element are improved for the molded resin and the semi-conductor light-emitting device constructed using it, and as a consequence the durability of the device is also improved.

When this thermal conductivity is less than 0.4, the phosphor layer present in the device tends to undergo thermal degradation due to the heat generated by the light emitted from the semiconductor light-emitting element in the device.

The thermal conductivity here can be controlled into the above-indicated range by the use of alumina or boron nitride for the white pigment (B) present in the material for a molded resin for a semi-conductor light-emitting device.

<1.8. The Reflectivity of the Molded Resin>

The molded resin that uses the molded resin material of the present invention preferably can maintain a high reflectivity for visible light. Specifically, the reflectivity for light at 460 nm is preferably at least 80% and more preferably is at least 90%. In addition, the reflectivity for light at a wavelength of 400 nm is preferably at least 60%, more preferably at least 80%, and even more preferably at least 90%.

This reflectivity by the molded resin refers to the reflectivity measured on the 0.4 mm-thick molding provided by thermally curing and molding the molded resin material of the present invention. This thermal curing can be carried out, for example, by curing for 4 minutes at 180° C. under a pressure of 10 kg/cm$^1$.

The reflectivity of the molded resin can be controlled through, for example, the type of resin (for example, the reflectivity can be controlled by changing the refractive index of the resin), the type of filler, and the particle diameter and content of the filler.

<2. Methods for Molding the Molded Resin for a Semiconductor Light-Emitting Device>

The method for molding the molded resin of the present invention for a semiconductor light-emitting device can be exemplified by compression molding methods, transfer molding methods, and injection molding methods. Among these, injection molding methods and particularly liquid injection molding (LIM molding) methods are preferred because they do not produce wasted cured material and do not require secondary processing (that is, are resistant to the generation of flash) and because they offer the major advantages of automation of the process for molding the molded resin, a shortening of the molding cycle, and enabling cost reduction for the molded product. When LIM molding and transfer molding are compared, LIM molding offers the advantages of a greater freedom, for the shape of the molding and a relatively inexpensive molding device and mold.

The injection molding methods can be carried out using an injection molding machine. The cylinder setting temperature may be selected as appropriate in conformity to the material, but is generally not more than 100° C., preferably not more than 80° C. and more preferably not more than 60° C. The mold temperature is 80° C. or more and 300° C. or less, and preferably is 100° C. or more and 250° C. or less, and more preferably is 120° C. or more and 200° C. or lees. The injection time will vary with the material, but is generally several seconds or not more than 1 second. The molding time may be selected as appropriate in conformity to the gelation rate and cure rate of the material, but is generally 3 seconds or more and 600 seconds or less, preferably 5 seconds or more and 200 to errors or less, and more preferably 10 seconds or more and 60 seconds or less.

When a resin is molded by liquid injection molding (LIM molding), the cold resin is introduced into a hot mold and the viscosity rises accompanying the chemical reaction, and as a consequence the resin typically reaches the mold unchanged with an inadequate viscosity rise. That is, a delay in the viscosity rise for the temperature conditions is produced, and as a consequence the viscosity of the resin must be controlled and the mold-to-mold precision and the precision of the clearances between the lead frame and mold must also be high. In the case of an inadequate viscosity rise when the resin reaches the mold, the resin can leak out from the clearances in the mold and the clearances between the lead frame and mold and flashing is then easily produced. A mold clearance precision of generally not more than 10 μm, preferably not more than 5 μm, and more preferably not more than 3 μm is required. Preheating the lead frame prior to its introduction into the mold also has the effect of inhibiting the generation of flash along the leads.

Moreover, the penetration of the material into narrow spaces can be promoted and the generation of air voids within the molded product can be prevented by placing the mold under a vacuum when the resin is molded.

When the degree of curing is represented graphically as a function of the curing time in liquid injection molding (LIM molding), the graph preferably ascends in an S-shape. Incomplete filling of the mold can occur when the initial rise in the cure is too rapid. Controlling the cure rate of the material and adjusting the viscosity are very important for inhibiting flashing and preventing incomplete filling of the mold. Once the resin material has been filled into the mold, a faster cure is favorable because this can shorten the molding cycle and improve the releasability through cure shrinkage.

The time to cure completion is generally within 60 seconds, preferably within 30 seconds, and more preferably within 10 seconds. A post-cure may be implemented as necessary. The cure rate can be adjusted through the selection of the type of platinum catalyst, the amount of catalyst, the use of a cure rate controlling agent, and the degree of crosslinking of the polyorganosiloxane, and also through molding conditions such as the mold temperature, the filling rate, and the injection pressure.

Compression molding methods can be carried out using a compression molding machine. The molding temperature may be selected as appropriate in conformity to the material, but is generally 80° C. or more and 300° C. or less, preferably 100° C. or more and 250° C. or less, and more preferably 120°

C. or more and 200° C. or less. The molding time may be selected as appropriate in view of the cure rate of the material, but is generally 3 seconds or more and 1200 seconds or less, preferably 5 seconds or more and 900 seconds or less, and more preferably 10 seconds or more and 600 seconds or less.

Transfer molding methods can be carried out using a transfer molding machine. The molding temperature may be selected as appropriate in conformity to the material, but is generally 80° C. or more and 300° C. or less, preferably 100° C. or more and 250° C. or less, and more preferably 120° C. or more and 200° C. or less. The molding time may be selected as appropriate in view of the gelation rate or cure rate of the material, but is generally 3 seconds or more and 1200 seconds or less, preferably 5 seconds or more and 900 seconds or less, and more preferably 10 seconds or more and 600 seconds or less.

A post-cure may optionally be carried out with any of the molding methods, and the poet-cure temperature is 100° C. or more and 300° C. or less, preferably 150° C. or more and 250° C. or less, and more preferably 170° C. or more and 200° C. or less. The post-cure time is generally 3 minutes or more and 24 hours or less, preferably 5 minutes or more and 10 hours or less, and more preferably 10 minutes or more and 5 hours or less.

<3. The Semiconductor Light-Emitting Device Package and the Semiconductor Light-Emitting Device>

The molded resin of the present invention for a semiconductor light-emitting device is generally used for a semiconductor light-emitting device in which a semiconductor light-emitting element is mounted. The semiconductor light-emitting device is composed of, for example, a semiconductor light-emitting element 1, a molded resin 2, a bonding wire 3, an encapsulant 4, a lead frame 6, and so forth, as shown in FIG. 1. In this case, the insulating molded resin and the electroconductive material, e.g., the lead frame 5, are referred to as the package.

Figure 2:
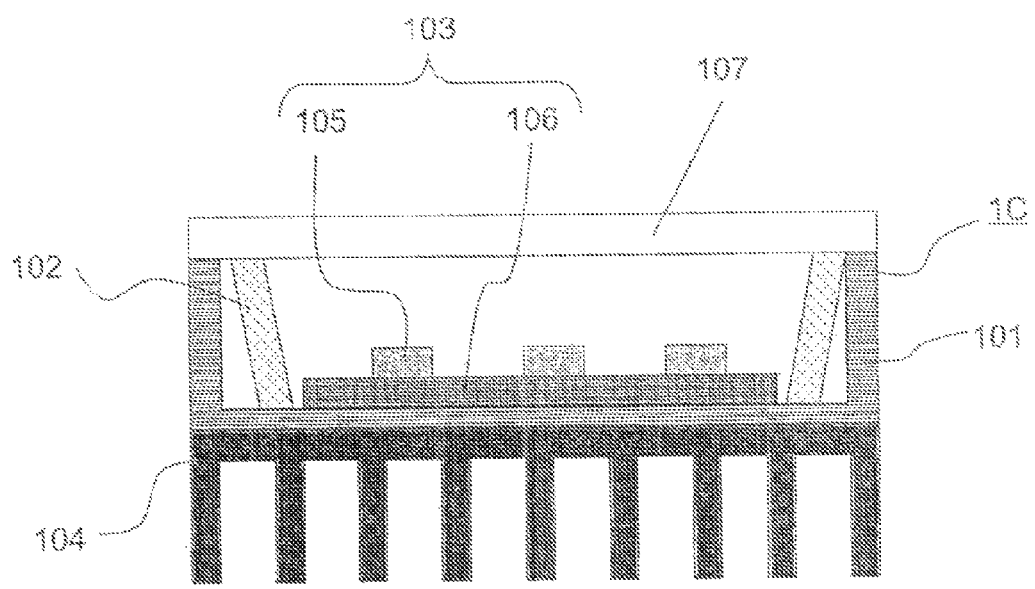
FIG. 2 is a cross-sectional diagram that schematically depicts the structure of another mode of a semiconductor light-emitting device.

The semiconductor light-emitting element 1 can be, for example, a near-ultraviolet semiconductor light-emitting element that emits light at a wavelength in the near-ultraviolet region, a violet, semiconductor light-emitting element that emits light at a wavelength in the violet region, or a blue semiconductor light-emitting element that emits light at a wavelength in the blue region, and emits light at a wavelength 350 nm or more and 520 nm or lees. While only one semiconductor light-emitting element is mounted in FIG. 1, a plurality of semiconductor light-emitting elements may be positioned, as shown in FIG. 2, in a linear or planar configuration, vide infra. Area lighting can be provided by positioning the semiconductor light-emitting elements 1 in a planar configuration, and such an embodiment is preferred when it is desired to intensify the output.

The molded resin 2 that is a constituent of the package is molded in combination with the lead frame 5. There are no particular limitations on the shape of the package, and it may be a flat plane or cup-shaped. The entire molded resin 2 may be composed of the molded resin material of the present invention, or a portion thereof may comprise the molded resin material of the present invention. A mode in which the molded resin constituting the reflector component 102 is molded from the molded resin material of the present invention, as shown in FIG. 2 discussed below, is a specific example of the case in which a portion of the molded resin 2 is comprised of the molded resin material of the present invention.

The lead frame 5 is composed of an electroconductive metal and functions to energize the semiconductor light-emitting element 1 by feeding power from outside the semiconductor light-emitting device.

The bonding wire 3 functions to fix the semiconductor light-emitting element 1 in the package. In addition, in those instances wherein the semiconductor light-emitting element 1 is not in contact with the lead frame, which forms an electrode, the electroconductive bonding wire 3 functions to feed power to the semiconductor light-emitting element 1. The bonding wire 3 is bonded to the lead frame 3 by compression bonding and the application of heat and ultrasonic vibration.

Figure 3:
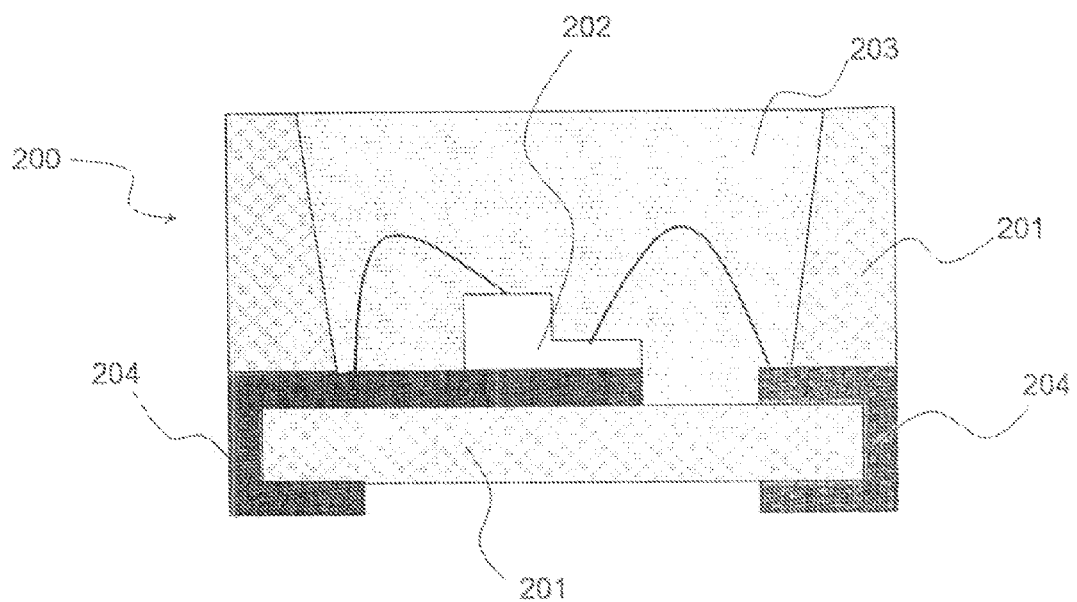
FIG. 3 is a cross-sectional diagram that schematically depicts one mode of a semiconductor light-emitting device that is provided with a conventional package.

The molded resin 2, which comprises the molded resin material of the present invention, can make the exposed area of the lead frame 5 very small. The molded resin molded from the molded resin material of the present invention tends to have a reflectivity equal to or higher than that of the material of the lead frame (for example, silver), and as a consequence a high package reflectivity can be maintained even when the molded resin presents a large exposed area. As a result, a semiconductor light-emitting device with a structure different from that of conventional packages can also be obtained by using a package comprising the material of the present invention for a molded resin. For example, a semiconductor light-emitting device 200 equipped with a conventional package is shown in FIG. 3. The lead frame 204 has a large exposed area, in the semiconductor light-emitting device shown in FIG. 3. Since the reflectivity of the molded resin 201 has been lower than that of the lead frame 204, it has been necessary, in order for the semiconductor light-emitting device to realize a high luminance, to provide a large surface area for a lead frame 204 that uses a high reflectivity material. When the lead frame 204 has such a large exposed area, the light emission efficiency may be reduced due to discoloration of the lead frame when the package is used installed in a light-emitting device. However, the decline in the light emission efficiency caused by this discoloration of the lead frame can be stopped by having the exposed area of the lead frame 5 be small, as in FIG. 1.

The molded resin 2 that is a constituent of the package is mounted with the semiconductor light-emitting element 1 and is sealed with a phosphor-admixed, encapsulant 4. The encapsulant 4 is a mixture provided by mixing a phosphor into a binder resin; the phosphor converts the excitation light from the semiconductor light-emitting element 1 and emits fluorescence at a different wavelength from the excitation light. In the present embodiment, the encapsulant also functions as the phosphor layer. The phosphor present in the encapsulant 4 is selected as appropriate in conformity to the wavelength of the excitation light from the semiconductor light-emitting element 1. When a blue light-emitting semiconductor light-emitting element is used as the excitation light source for a white light-emitting semiconductor light-emitting device (white LED), the white light can be produced be incorporating green and red phosphors in the phosphor layer. In the case of a violet-emitting semiconductor light-emitting element, white light can be produced by incorporating blue and yellow phosphors in the phosphor layer or by incorporating blue, green, and red phosphors in the phosphor layer.

For the binder resin present in the encapsulant 4, an appropriate selection can generally be made from transparent resins known, for use in encapsulants. Specific examples are epoxy resins, silicone resins, acrylic resins, polycarbonate resins, and so forth, wherein the use of silicone resins is preferred.

Another mode of the semiconductor light-emitting device of the present invention will be described in detail using FIG. 2.

The semiconductor light-emitting device 1C of this embodiment is composed of a window-equipped housing 101, a reflector component 102, a light source component 103, and a heat sink 104. This light source component 103 is provided with a light-emitting component 105 on a circuit substrate, and a chip-on-board (COB) configuration may be used in which the semiconductor light-emitting element is directly mounted on the circuit substrate 106 or a configuration may be used in which the semiconductor light-emitting device is surface mounted, as in FIG. 1. When the light source component 103 has the COB configuration, the semiconductor light-emitting element may be sealed, without using a frame, by an encapsulant resin molded in a dome shape or flat plate shape. A single semiconductor light-emitting element or a plurality of semiconductor light-emitting elements may be mounted on the circuit substrate 106. The reflector component 102 and the heat sink 104 may be formed into a single body with the housing 101 or may each be separate therefrom and can be used as required. Viewed from the perspective of thermal radiation, the light source component 103, the housing 101, and the heat sink 104 preferably have a single body structure or are in gapless contact intermediated by a high thermal conductivity sheet or grease. For example, a known transparent resin or optical glass can be used for the window 107, and this window 107 may have a flat shape or may have a curved surface.

In the case of a phosphor-based white LED, the phosphor component may be disposed at the light source component 103 or may be disposed at the window 107. The disposition at the window 107 enables the phosphor to be placed at a position that is separated from the light-emitting element and thus offers the advantage of inhibiting deterioration of the phosphor, which is readily degraded by heat and light, and thereby mating it possible to obtain uniform, high luminance white light on a long-term basis.

When a phosphor layer is disposed at the window 107, production can be carried out by a method in which the phosphor layer is, for example, screen printed, die coated, or spray coated on (not shown) a transparent window material. Since, in such a configuration, the semiconductor light-emitting element and the phosphor layer are disposed with a distance opened therebetween, deterioration of the phosphor layer by the light energy from the semiconductor light-emitting element can be prevented, while the output of the light-emitting device can also be improved. The distance between the semiconductor light-emitting element and the phosphor layer of the window 107 is preferably from 5 to 50 mm. In order to reduce self-reabsorption and reabsorption among the individual RGB phosphors, the phosphor layer for FIG. 3 can be executed as a multilayer structure in which the phosphor for each color used is separately coated or can be formed in a pattern, such as stripes or dots.

The shape of each feature of the semiconductor light-emitting device 1C is not limited to that shown in the figure, and the device may be fabricated, for example, with a curved surface feature or as necessary with an attached dimmer or circuit protection device.

The location where the molded resin according to the present invention (referred to below simply as the "optical member") is deployed in the semiconductor light-emitting device of the present invention as described hereabove is not particularly limited to that already described above. For example, it can be used for each of the following members in the semi-conductor light-emitting device 1C shown in FIG. 2; the housing 101, the reflector component 102, the light source component 103, the light-emitting component 105, and the circuit substrate 106. The molded resin according to the present invention exhibits a high reflectivity for ultraviolet-to-visible light and an excellent heat resistance and light resistance, and in consequence thereof can inexpensively provide a highly durable high-luminance lighting device in which the required number of semiconductor light-emitting elements has been brought down. In particular, through its high reflectivity for ultraviolet-to-blue light, the molded resin of the present invention can effectively reflect the light generated from the semiconductor light-emitting element prior to wavelength conversion by the phosphor and is thus well adapted for embodiments in which the phosphor layer is positioned at a location separated from the light source component. When the emitted light color of the semiconductor light-emitting element is ultraviolet to near-ultraviolet, the main component of the reflective filler is preferably alumina, while in the case of a blue emitted light color the main component is preferably alumina and/or titania.

The following characteristics are exhibited by a preferred molded resin for a semiconductor light-emitting device, said molded resin being provided by molding the material of the present invention for a molded resin for a semiconductor light-emitting device.

<3-1. The Reflectivity of the Semiconductor Light-Emitting Device Package>

The semiconductor light-emitting device package of the present invention is characterized by the ability to maintain a high reflectivity not only for visible light, but also for ultraviolet light and near-ultraviolet light having a shorter wavelength than violet. The reflectivity for light at a wavelength of 360, 400, and 460 nm is in each case generally at least 60%, preferably at least 80%, and more preferably at least 90%. A semiconductor light-emitting device package provided with the molded resin of the present invention, which exhibits a high reflectivity from the ultraviolet region to the visible region, has very good characteristics not seen in prior semiconductor light-emitting device packages. Particularly for semiconductor light-emitting device packages made of a resin such as a polysiloxane, these are characteristics that the individual skilled in the art could not heretofore have easily hit upon and the technical significance is quite substantial.

<3-2 The Thickness of the Semiconductor Light-Emitting Device Package>

The semiconductor light-emitting device package of the present invention generally has a chip-mounting surface and a back surface on the side opposite from this chip-mounting surface. In such cases, the distance between this chip-mounting surface and the back surface, i.e., the thickness of the semiconductor light-emitting device package, is generally at least 100 µm and preferably at least 200 µm. It is generally not more than 3000 µm and preferably not more than 2000 µm. When the thickness is too small, problems can appear such as the penetration of light to the back surface and a reduction in the reflectivity and an inadequate package strength resulting in deformation during handling. When the thickness is too large, the package itself is also thick and bulky, resulting in limitations on the uses and applications of the semiconductor light-emitting device.

EXAMPLES

The present invention is described in additional detail with the following examples, but the present invention is in no way limited by these examples.

Example 1

Synthesis of Polyorganosiloxane (1)

A vinyl group-containing polydimethylsiloxane (vinyl group content: 1.2 mmol/g, viscosity adjusted to 1000 mPa·s by the addition of finely divided silica particles, contained 6.8 ppm of a platinum complex catalyst) and a hydrosilyl group-containing polydimethylsiloxane (vinyl group content: 0.3 mmol/g, hydrosilyl group content: 1.8 mmol/g, viscosity adjusted to 2100 mPa·s by the addition of finely divided silica particles) were mixed at 1:1 to obtain a liquid heat-curable polyorganosiloxane (1) having a viscosity of 1500 mPa·s and a platinum concentration of 3.4 ppm.

The finely divided silica particles corresponded to the fluidity controlling agent (E) and were added at a polyorganosiloxane:finely divided silica particle (weight ratio) of from 80:20 to 89.5:10.5 to provide the viscosities indicated above.

[Synthesis of Polyorganosiloxane (2)]

A vinyl group-containing polydimethylsiloxane (vinyl group content: 0.3 mmol/g, viscosity: 3500 mPa·s, contained 8 ppm of a platinum complex catalyst), a hydrosilyl group-containing polydimethylsiloxane (vinyl group content: 0.1 mmol/g, hydrosilyl group content: 4.6 mmol/g, viscosity: 600 mPa·s), and a retarding component (cure rate controlling agent (D))-containing polydimethylsiloxane (vinyl group content: 0.2 mmol/g, hydrosilyl group content: 0.1 mmol/g, alkynyl group content: 0.2 mmol/g, 500 mPa·s) were mixed at 100:10:5 to obtain a liquid heat-curable polyorganosiloxane (2) having a platinum concentration of a ppm.

The refractive index of this liquid heat-curable polyorganosiloxane (2) was 1.41.

[Preparation of the Material for a Molded Resin and Test Piece Fabrication]

(A) The liquid heat-curable polyorganosiloxane (1) obtained as described above, (B) white pigment (refer to Table 1 below), and (E) fluidity controlling agent in the form of "AEROSIL RX200" (specific surface area: 140 m²/g) finely divided silica particles were blended in the weight ratio shown in Table 1 and the white pigment and finely divided silica particles were dispersed in (1) by stirring to obtain a white material for a molded resin. Using a hot press, these materials were cured for a cure time of 240 seconds at 10 kg/cm² and 180° C. to obtain a circular test piece with a diameter of 13 mm. The thickness of each test piece is given in Table 3.

[Measurement of the Primary Particle Diameter of the White Pigment and the Aspect Ratio of the Primary Particles of the White Pigment]

The primary particle diameter of the white pigments (alumina powder) used in the examples was measured by SEM observation. When the particle diameter exhibited variation, several points (for example, 10 points) were subjected to SEM observation and the average value was then used for the particle diameter. In particular, when a large variation occurred, for example, when the difference between the small particle diameter and the large particle diameter was greater than or equal to about 5 times excluding coarse particles and microfine particles present in trace amounts, the maximum value and minimum value were recorded. In addition, the length of the major axis (the largest long diameter) and the length of the minor axis (the length of the longest part in the direction perpendicular to the long diameter) were also measured, and the length of the major axis was used for the primary particle diameter and the value obtained by dividing the length of the major axis (the largest long diameter) by the length of the minor axis (the length of the longest part in the direction perpendicular to the long diameter) was used as the aspect ratio. The results are given in Table 1.

[Measurement of the Median Diameter $D_{50}$ of the Secondary Particles in the White Pigment]

10 g of a 0.2% aqueous sodium polyphosphate solution was added to 10-20 mg of the white pigment (alumina powder) and the alumina was dispersed by ultrasonic vibration. Using this dispersion, the volume-based median diameter $D_{50}$ of the secondary particles in the white pigment was measured with a Microtrac MT3000II from Nikkiso Co., Ltd. The median diameter $D_{50}$ refers to the particle diameter at the point where the volume based particle size distribution curve in cumulative % intersects with the horizontal axis at 50%. The results are given in Table 1.

[Measurement of the Crystallite Size in the White Pigment]

The crystal system was determined by carrying out X-ray diffraction measurement on the alumina powder using an X'Pert Pro MPD from PANalytical B.V. The (113) crystallite size was calculated for the α-alumina using the Scherrer equation.

Examples 2 to 9 and Comparative Examples 1 To 7

Test pieces with the thicknesses shown in Table 3 were obtained using the same conditions as in Example 1, but using the white pigment given in Table 2 and preparing the blend of (A) liquid heat-curable polyorganosiloxane (1) or (2), (B) white pigment, and "AEROSIL RX200" finely divided silica particles as the (E) fluidity controlling agent using the weight ratio shown in Table 2.

The white pigments A to J in Table 2 are described in Table 1.

TABLE 1

| white pigment | type | shape | primary particle diameter x (μm) | median diameter of the secondary particles y (μm) | y/x | aspect ratio | crystal system | 113 crystallite size (Å) | purity |
|---|---|---|---|---|---|---|---|---|---|
| A | alumina | crushed | 0.3 | 1.2 | 4 | 1.48 | α | 1020 | 99.1 |
| B | alumina | crushed | 0.2 to 1 | 1.4 | 1.4 to 7 | 1.63 | α | 1010 | 99.4 |
| C | alumina | crushed | 0.3 | 0.49 | 1.6 | 1.59 | α | 650 | 99.6 |
| D | alumina | crushed | 0.014 | 0.4 | 28.6 | — | γ | — | >99.99 |
| E | alumina | crushed | 3 to 5 | 3.6 | 1 | 1.58 | α | 1260 | 99.9 |
| F | alumina | spherical | 0.1 to 0.8 | 0.46 | 1 | 1.08 | non-α | — | >99.8 |
| G | alumina | spherical | 3 | 3 | 1 | 1.04 | non-α | — | >99.0 |
| H | alumina | crushed | 3.2 | 5.8 | 1.8 | — | α | — | 99.5 |
| I | titania | crushed | 0.28 | — | — | 1.45 | rutile | — | 90 |
| J | titania | crushed | 0.03 to 0.05 | — | — | — | rutile | — | 93 to 98 |

The titania designated as white pigment I had a thin-film coating of silica and alumina on its surface.
The "—" in the table indicates that the measurement was not performed.

TABLE 2

| | resin (poly-organosiloxane) | white pigment | fluidity controlling agent | blending ratio: resin/white pigment/finely divided silica particles (the numerical value for the finely divided silica particles excludes the finely divided silica particles present in the resin) |
|---|---|---|---|---|
| Example 1 | (1) | C | finely divided silica particles | 40/60/0 |
| Example 2 | (1) | A | finely divided silica particles | 40/60/0 |
| Example 3 | (1) | A | finely divided silica particles | 35/60/5 |
| Example 4 | (1) | B | finely divided silica particles | 40/60/0 |
| Example 5 | (1) | B | finely divided silica particles | 25/70/5 |
| Example 6 | (2) | A | finely divided silica particles + spherical silica with a particle diameter of 4 μm | 30.6/52/4.4 (also include 13 for the spherical silica) |
| Example 7 | (2) | A | finely divided silica particles | 56.9/35/8.1 |
| Example 8 | (2) | I | 0 | 40/60/0 |
| Example 9 | (2) | A, I | 0 | 40/60 (A:I = 48:12)/0 |
| Comp. Example 1 | (1) | F | finely divided silica particles | 40/60/0 |
| Comp. Example 2 | (1) | G | finely divided silica particles | 40/60/0 |
| Comp. Example 3 | (1) | D | finely divided silica particles | 51/49/0 |
| Comp. Example 4 | (1) | E | finely divided silica particles | 40/60/0 |
| Comp. Example 5 | (2) | H | finely divided silica particles | 35/60/5 |
| Comp. Example 6 | (2) | H | 0 | 20/80/0 |
| Comp. Example 7 | (2) | J | 0 | 40/60/0 |

In the case of the material in Comparative Example 3, which used an alumina with a primary particle diameter less than 0.1 μm, the viscosity was raised to the point that the difficulty of dispersing the white pigment made possible only a 49% alumina loading.

[Reflectivity Measurements on the Test Pieces]

Figure 4:
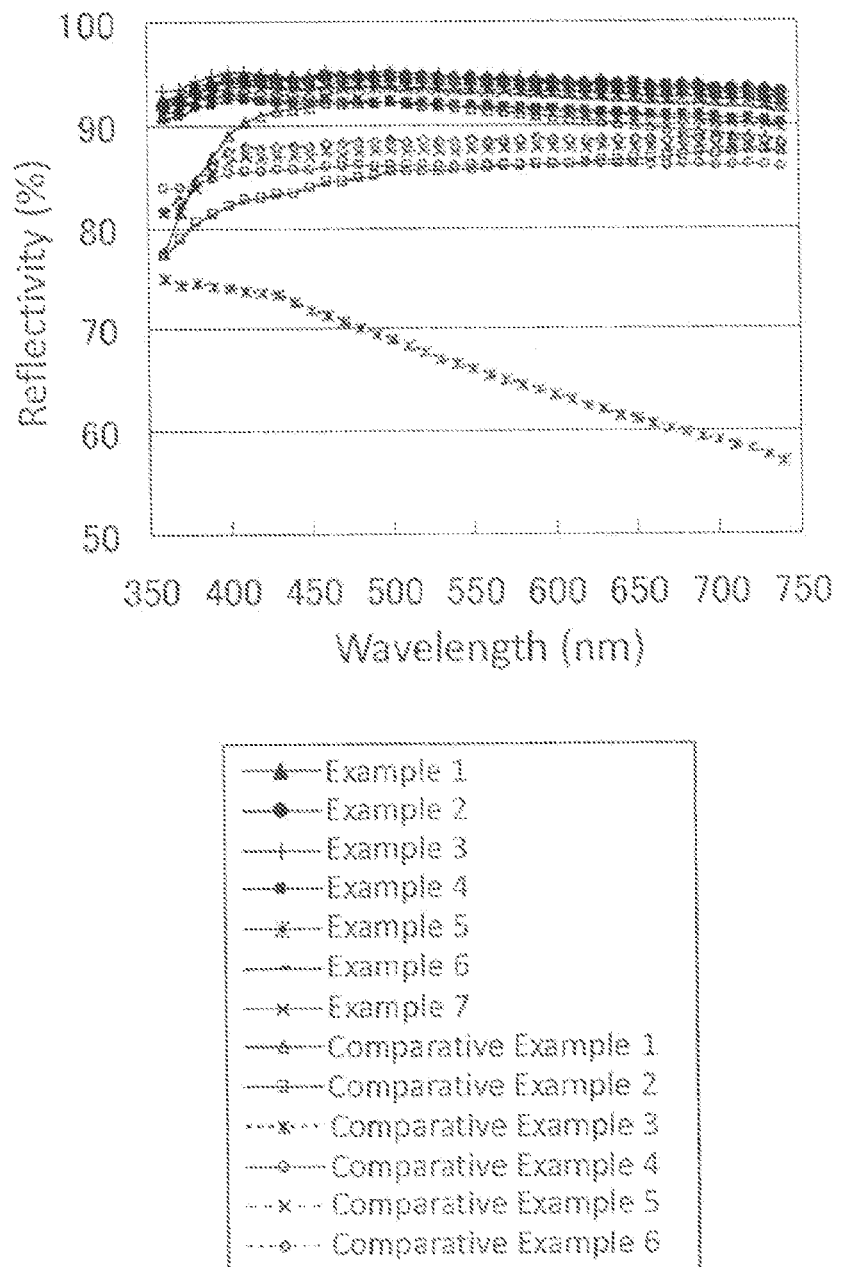
FIG. 4 is a graph that shows the results of reflectivity measurements on the test pieces of Examples 1 to 7 and Comparative Examples 1 to 6.
Figure 5:
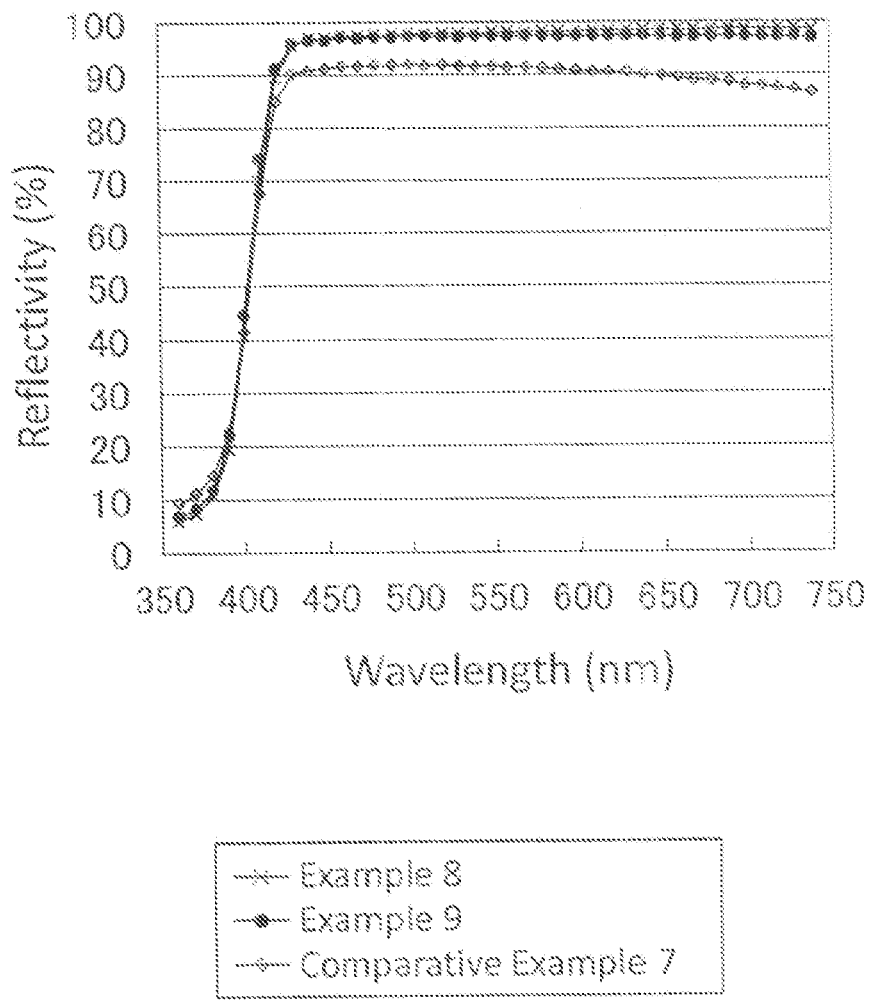
FIG. 5 is a graph that shows the results of reflectivity measurements on the test pieces of Examples 8 and 9 and Comparative Example 7.

Using a SPECTROPHOTOMETER CM-2600d from Konica Minolta, the reflectivity at wavelengths from 360 nm to 740 nm was measured on a 6 mm measurement diameter on each of the test pieces in Examples 1 to 9 and Comparative Examples 1 to 7. The results are shown in Table 1 and FIG. 4. The reflectivity was also measured on very thin test pieces in Examples 2 and 9 and Comparative Example 5.

TABLE 3

| | reflectivity for 400 nm light | reflectivity for 460 nm light | test piece thickness (μm) |
|---|---|---|---|
| Example 1 | 94.6 | 94.9 | 400 |
| Example 2 | 94.4 | 94.8 | 420 |
| Example 3 | 95.1 | 95.1 | 410 |
| Example 4 | 92.4 | 92.5 | 360 |
| Example 5 | 93.7 | 93.8 | 370 |
| Example 6 | 94.1 | 93.8 | 340 |
| Example 7 | 93.0 | 92.6 | 420 |
| Example 8 | 40.6 | 97.5 | 320 |
| Example 9 | 44.6 | 97.1 | 290 |
| Comparative Example 1 | 89.0 | 92.2 | 360 |
| Comparative Example 2 | 82.2 | 84.5 | 520 |
| Comparative Example 3 | 74.0 | 71.4 | 1000 |
| Comparative Example 4 | 85.4 | 86.0 | 370 |
| Comparative Example 5 | 86.5 | 87.4 | 520 |
| Comparative Example 6 | 87.4 | 88.3 | 470 |
| Comparative Example 7 | 41.4 | 91.6 | 370 |
| Example 2 | 88.0 | 86.9 | 120 |
| Example 9 | 44.6 | 95.2 | 120 |
| Comparative Example 5 | 70.9 | 70.3 | 120 |

According to Table 3, a very high reflectivity at 460 nm was demonstrated in Examples 1 to 9, which used a nonspherical white pigment that had the prescribed values for the primary particle diameter and aspect ratio. In addition, Table 3 also shows that when the white pigment was alumina a high reflectivity was maintained over a broad range from the ultraviolet region to the visible light region. On the other hand, it was shown, that the reflectivity at 460 nm was somewhat reduced in Comparative Examples 1 and 2, which used a spherical white pigment. Moreover, even when the white pigment was alumina, the extent of the decline was shown to be substantial for the reflectivity as 400 nm. The reflectivity was low in Comparative Examples 3 and 7, which used alumina with a primary particle diameter below 0.1 μm, and in comparative Examples 4, 5, and 6, which used alumina with a primary particle diameter above 2 μm.

In the case of the 120 μm-thick test pieces, Examples 2 and 9 had a higher reflectivity for 460 nm light than did Comparative Example 5 and maintained a relatively high reflectivity even for the thin material. In particular, it was found that little decline in reflectivity occurred for the thin test piece in Example 9, which had titania blended in the alumina.

[Measurement of the Viscosity of the Material for a Molded Resin]

Using an RMS-800 from Rheometries, Inc., with parallel plate, the viscosity was measured at a measurement temperature of 25° C. on each of the materials for a molded resin of Examples 1 to 7 and Comparative Examples 2, 4, 5 and 6.

Figure 6:
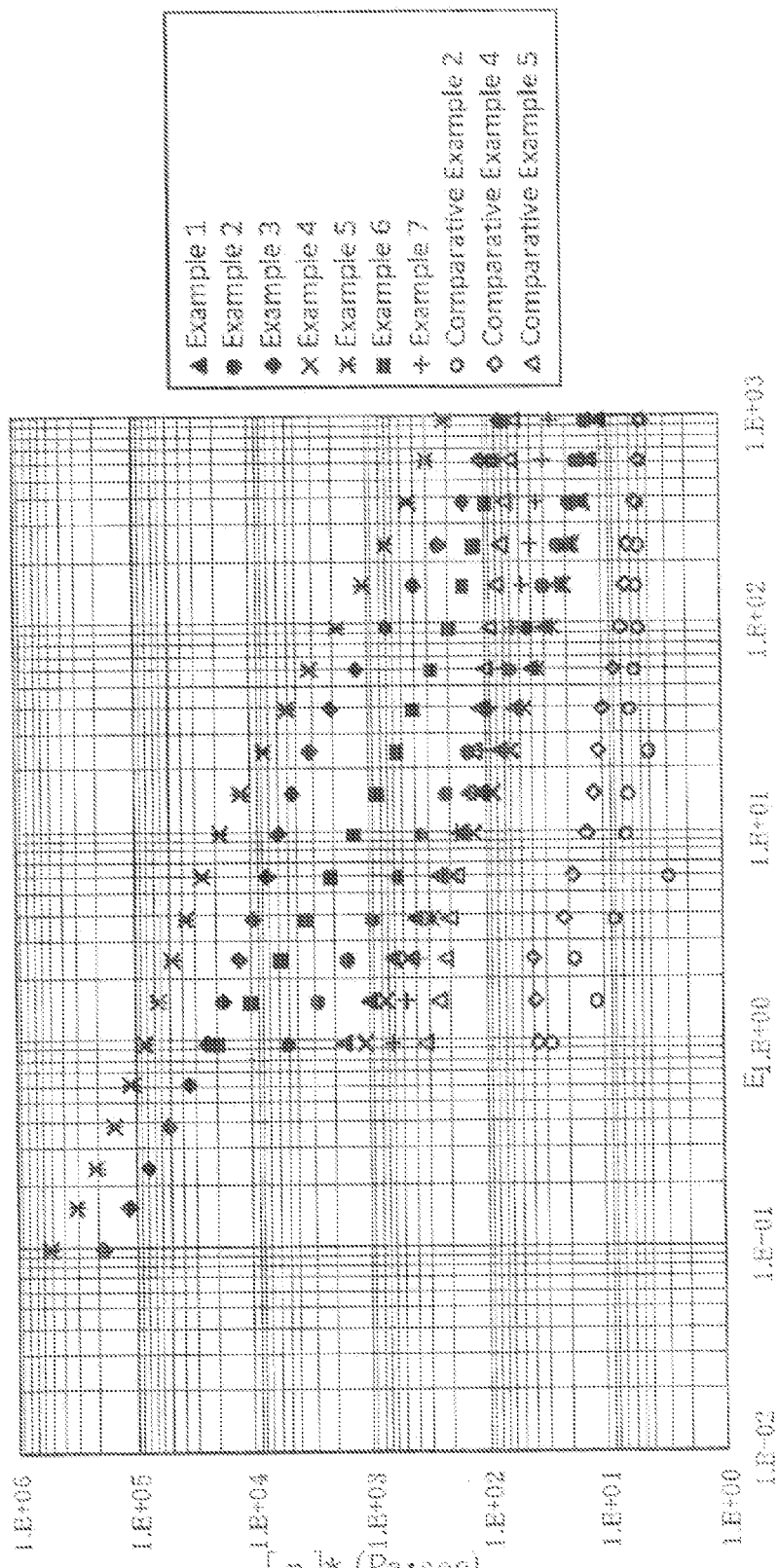
FIG. 6 is a graph that shows the results of viscosity measurements on the molded resin materials of Examples 1 to 7 and Comparative Examples 2, 4, and 5.

The results are shown in Table 1 and FIG. 6. It is demonstrated here that, for all the materials in Examples 1 to 7, the viscosity at 25° C. and a shear rate of 1 s⁻¹, the viscosity at 25° C. and a shear rate of 100 s⁻¹, and their trends are entirely suitable for molding a molded resin. On the other hand, the viscosity values in the comparative examples are shown to be substantially different from those in the examples. The viscosity in Comparative Example 6 was so high that slippage occurred between the parallel plates and the sample and accurate measurements could not be taken.

TABLE 4

|  | viscosity (1 s⁻¹) (Pa·s) | viscosity (100 s⁻¹) (Pa·s) | viscosity ratio (1 s⁻¹/100 s⁻¹) |
|---|---|---|---|
| Example 1 | 1617.1 | 30.3 | 53.4 |
| Example 2 | 4859.6 | 41.9 | 116.0 |
| Example 3 | 24290.2 | 701.5 | 34.6 |
| Example 4 | 1099.6 | 26.1 | 42.2 |
| Example 5 | 80644.9 | 1827.3 | 44.1 |
| Example 6 | 19506.1 | 198.3 | 98.4 |
| Example 7 | 641.9 | 56.5 | 11.4 |
| Comparative Example 2 | 27.2 | 4.8 | 5.7 |
| Comparative Example 4 | 35.6 | 7.1 | 5.0 |
| Comparative Example 5 | 334.0 | 88.6 | 3.8 |
| Comparative Example 6 | measurement not possible | measurement not possible | measurement not possible |

Example 10

A package for a semiconductor light-emitting device was molded by liquid injection molding using the material of Example 3 in combination with a copper lead frame that had been silver plated over its entire surface. This package was a cup-shaped surface-mount package with the resin portion having length 3.2 mm×width 2.7 mm×height 1.4 mm and a concave portion with a diameter of 2.4 mm for the opening. Molding was performed for a curing time of 20 seconds at a mold temperature of 170° C. Observation of the molded package showed the package to be free of flash and free of short molding.

Example 11

A package for a semiconductor light-emitting device was molded by liquid injection molding using the material of Example 3 in combination with a copper lead frame that had been silver plated over its entire surface. This package was a cup-shaped surface-mount package having length 5 mm×width 5 mm×height 1.5 mm and a concave portion with a diameter of 3.6 nm for the opening. Molding was performed for a curing time of 180 seconds with a 150° C. mold. The molded package was sectioned with a microtome while frozen with liquid nitrogen and the package cross section was observed by SEM. The primary particle diameter of the alumina exposed in the cross section was 0.3 μm and the primary particle aspect ratio was 1.42.

EXPLANATION OF REFERENCE NUMERALS 1 semiconductor light-emitting element
2 molded resin
3 bonding wire
4 encapsulant
5 lead frame
10 semiconductor light-emitting device
101 housing
102 reflector component
103 light source component
104 heat sink
105 light-emitting component
106 circuit substrate
107 window
200 conventional semiconductor light-emitting device
201 molded rosin
202 semiconductor light-emitting element
203 encapsulant
204 lead frame

The invention claimed is:

1. A material for a molded resin,
comprising (A) a polyorganosiloxane, (B) a white pigment, (C) a curing catalyst, (D), a cure rate controlling agent, and (E) a fluidity controlling agent,
wherein
the polyorganosiloxane (A) is a thermosetting polyorganosiloxane that is a liquid at normal temperature and normal pressure,
the polyorganosiloxane (A) comprises an addition polyorganosiloxane represented by the following general formula (2)

$$R_nSiO_{[(4-n)/2]} \quad (2)$$

and having at least two silicon atom-bonded alkenyl groups in each molecule, where each R in formula (2) is independently selected from the group consisting of identical or different substituted or unsubstituted monovalent hydrocarbon groups, alkoxy groups and the hydroxyl group, at least 80% of the R is the methyl group, and n is a positive number that satisfies $1 \leq n < 2$;

the white pigment (B) has:
(a) a primary particle aspect ratio of 1.2 to 4.0, and
(b) a primary particle diameter of 0.1 μm to 2.0 μm;
the material having (i) a viscosity at a shear rate of 100 s⁻¹ and 25° C. of 10 Pa·s to 10,000 Pa·s, and (ii) a ratio of (iia) viscosity at a shear rate of 1 s⁻¹ to (iib) viscosity at a shear rate of 100 s⁻¹, of 15 to 500;
the curing catalyst (C) is an addition polymerization catalyst, and
a total content of the white pigment (B) and the fluidity controlling agent (E) is at least 50 weight % with regard to the entire material for a molded resin.

2. The material according to claim 1, wherein a median diameter of secondary particles of the white pigment (B) is 0.2 μm to 5 μm.

3. The material according to claim 1, wherein the white pigment (B) is alumina.

4. The material according to claim 1, wherein the white pigment (B) comprises secondary particles, and a ratio y/x of the median diameter y of the secondary particles in the white pigment (B) to the primary particle diameter x in the white pigment (B) is 1 to 10.

5. The material according to claim 4, wherein said ratio y/x is 1.2 to 5.

6. A molded resin obtained by molding the material according to claim 1.

7. The molded resin according to claim 6, having a light reflectivity at a thickness of 0.4 mm and a wavelength of 400 nm of at least 60%.

8. The molded resin according to claim 6, wherein the molded resin is molded by liquid injection molding.

9. A semiconductor light-emitting device comprising the molded resin according to claim 6.

10. A method of producing a molded resin, comprising:
producing the material according to claim 1; and
molding the obtained material by injection molding.

11. The material according to claim 1, wherein said normal temperature is a temperature in the range of 20° C.±15° C.

12. The material according to claim 1, wherein said normal pressure is approximately one atmosphere.

13. The material according to claim 1, wherein said white pigment is at least one member selected from the group consisting of metal oxides, silicon oxide, titanium oxide (titania), zinc oxide, magnesium oxide, calcium carbonate, barium carbonate, magnesium carbonate, barium sulfate, aluminum hydroxide, calcium hydroxide, magnesium hydroxide, boron nitride, alumina white, colloidal silica, aluminum silicate, zirconium silicate, aluminum borate, clay, talc, kaolin, mica, synthetic mica, fluororesin particles, silicone and resin particles.

14. The material according to claim 1, further comprising a silane coupling agent.

15. The material according to claim 1, further comprising a spherical silica.

* * * * *